(12) United States Patent
Hirose et al.

(10) Patent No.: US 9,607,827 B2
(45) Date of Patent: Mar. 28, 2017

(54) METHOD OF MANUFACTURING SEMICONDUCTOR DEVICE, AND RECORDING MEDIUM

(71) Applicant: HITACHI KOKUSAI ELECTRIC INC., Tokyo (JP)

(72) Inventors: Yoshiro Hirose, Toyama (JP); Atsushi Sano, Toyama (JP); Katsuyoshi Harada, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/638,396

(22) Filed: Mar. 4, 2015

(65) Prior Publication Data

US 2015/0179427 A1   Jun. 25, 2015

Related U.S. Application Data

(63) Continuation of application No. 14/022,800, filed on Sep. 10, 2013, now Pat. No. 9,472,397.

(30) Foreign Application Priority Data

Sep. 14, 2012   (JP) .................................. 2012-203675

(51) Int. Cl.
*H01L 21/00*    (2006.01)
*H01L 21/02*    (2006.01)
(Continued)

(52) U.S. Cl.
CPC .......... *H01L 21/0228* (2013.01); *C23C 16/24* (2013.01); *C23C 16/36* (2013.01);
(Continued)

(58) Field of Classification Search
CPC .......... H01L 21/0228; H01L 21/02219; H01L 21/02211; H01L 21/02167; H01L 21/02123
See application file for complete search history.

(56) References Cited

U.S. PATENT DOCUMENTS

2001/0025205 A1*  9/2001  Chern .................... C23C 16/34
                                                 700/121
2011/0042686 A1    2/2011  Han et al.
(Continued)

FOREIGN PATENT DOCUMENTS

JP    2011-249764 A     12/2011
KR    2011-0104432       9/2011
(Continued)

*Primary Examiner* — Richard Booth
(74) *Attorney, Agent, or Firm* — Volpe and Koenig, P.C.

(57) ABSTRACT

A method of manufacturing a semiconductor device includes performing a cycle a predetermined number of times, the cycle including supplying a first precursor containing a specific element and a halogen group to form a first layer and supplying a second precursor containing the specific element and an amino group to modify the first layer into a second layer. A temperature of the substrate is set such that a ligand containing the amino group is separated from the specific element in the second precursor, the separated ligand reacts with the halogen group in the first layer to remove the halogen group from the first layer, the separated ligand is prevented from being bonded to the specific element in the first layer, and the specific element from which the ligand is separated in the second precursor is bonded to the specific element in the first layer.

15 Claims, 12 Drawing Sheets

(51) Int. Cl.
*C23C 16/24* (2006.01)
*C23C 16/36* (2006.01)
*C23C 16/455* (2006.01)

(52) U.S. Cl.
CPC .... *C23C 16/45525* (2013.01); *H01L 21/0262* (2013.01); *H01L 21/02123* (2013.01); *H01L 21/02167* (2013.01); *H01L 21/02211* (2013.01); *H01L 21/02219* (2013.01); *H01L 21/02532* (2013.01)

(56) References Cited

U.S. PATENT DOCUMENTS

| | | |
|---|---|---|
| 2011/0230057 A1 | 9/2011 | Takasawa et al. |
| 2011/0263105 A1 | 10/2011 | Hasebe et al. |
| 2013/0052836 A1 | 2/2013 | Hirose et al. |
| 2013/0078376 A1 | 3/2013 | Higashino et al. |

FOREIGN PATENT DOCUMENTS

| | | |
|---|---|---|
| WO | 2011/123792 A2 | 10/2011 |
| WO | 2011/125395 A1 | 10/2011 |

* cited by examiner

METHOD OF MANUFACTURING SEMICONDUCTOR DEVICE, AND RECORDING MEDIUM

CROSS-REFERENCE TO RELATED APPLICATION

This application is a continuation of U.S. application Ser. No. 14/022,800, filed Sep. 10, 2013, which based upon and claims the benefit of priority from Japanese Patent Application No. 2012-203675, filed on Sep. 14, 2012, the entire contents of which are incorporated herein by reference.

TECHNICAL FIELD

The present disclosure relates to a method of manufacturing a semiconductor device which includes a process of forming a thin film on a substrate, a substrate processing apparatus, and a recording medium.

BACKGROUND

A process of manufacturing a semiconductor device may include a process of forming a thin film, such as a silicon oxide film (a SiO film), a silicon nitride film (a SiN film), or the like containing a specific element, for example, silicon (Si), on a substrate. The SiO film has good insulation properties, low permittivity, etc. such that it is widely used as an insulating film or an interlayer film. Also, the SiO film has good insulation properties, corrosion resistance, permittivity, film stress controllability, or the like such that it is widely used as an insulating film, a mask film, a charge accumulating film, or a stress control film. Also, technology that adds carbon (C) into the thin films to form a silicon carbon nitride film (a SiCN film), a silicon oxide carbon nitride film (a SiOCN film), a silicon oxide carbon film (a SiOC film), or the like is known. Carbon is added into the thin film to enhance a wet etching resistance of the thin film to hydrogen fluoride (HF). In addition, a dielectric constant or refractive index of the thin film can be altered when carbon is added into the thin film. The thin film with carbon added can be used as an optical function film having a refractive index different from that of an adjacent film.

SUMMARY

Recently, as semiconductor devices are miniaturized in size and diversified in kind and so on, the demands for lowering a film-forming temperature in forming a thin film are increasing. Research for lowering the film-forming temperature is being actively done. However, it is difficult to perform formation processing of a silicon film (a Si film) using a monosilane ($SiH_4$) gas or a disilane ($Si_2H_6$) gas at a temperature range lower than 500 degrees C.

In a wet etching resistance to HF, a SiN film or a SiCN film has a resistance higher than that of a SiO film, and a Si film has a resistance far higher than that of the SiN film or SiCN film. That is, the Si film has a processing characteristic (for example, a wet etching resistance, etc.) that is substantially different from the SiO film such that the Si film can be used to process the SiO film or the like (for example, an etching mask film or the like when a base SiO film is etched with HF). At present, it is difficult to form a film having a processing characteristic greatly different from the SiO film at a low temperature range, and the type of films that can be formed at the low temperature range is limited. Therefore, if a thin film containing a specific element, for example, a Si film containing Si, can be formed at the low temperature range, it is possible to broaden range of film used as a processing film and range of processing methods.

The present disclosure provides some embodiments of a method of manufacturing a semiconductor device, a substrate processing apparatus, and a recording medium which can form a thin film containing a specific element, such as a silicon film, at a low temperature range.

According to one embodiment of the present disclosure, a method of manufacturing a semiconductor device includes performing a cycle a predetermined number of times to form a thin film composed of a specific element on a substrate, the cycle including: supplying a first precursor containing the specific element and a halogen group to the substrate to form a first layer containing the specific element and the halogen group; and supplying a second precursor containing the specific element and an amino group to the substrate to modify the first layer to form a second layer, wherein in the act of performing the cycle the predetermined number of times, a temperature of the substrate is set such that a ligand containing the amino group is separated from the specific element in the second precursor, the separated ligand reacts with the halogen group in the first layer to remove the halogen group from the first layer, the separated ligand is prevented from being bonded to the specific element in the first layer, and the specific element from which the ligand is separated in the second precursor is bonded to the specific element in the first layer.

According to another embodiment of the present disclosure, provided is a substrate processing apparatus including: a processing chamber configured to accommodate a substrate; a first precursor supply system configured to supply a first precursor containing a specific element and a halogen group to the substrate in the processing chamber; a second precursor supply system configured to supply a second precursor containing the specific element and an amino group to the substrate in the processing chamber; a heater configured to heat the substrate in the processing chamber; and a control unit configured to control the first precursor supply system, the second precursor supply system, and the heater such that a thin film composed of the specific element is formed on the substrate by performing a cycle a predetermined number of times, the cycle including: supplying the first precursor to the substrate in the processing chamber to form a first layer containing the specific element and the halogen group; and supplying the second precursor to the substrate to modify the first layer to form a second layer, and a temperature of the substrate being set such that a ligand containing the amino group is separated from the specific element in the second precursor, the separated ligand reacts with the halogen group in the first layer to remove the halogen group from the first layer, the separated ligand is prevented from being bonded to the specific element in the first layer, and the specific element from which the ligand is separated in the second precursor is bonded to the specific element in the first layer.

According to another embodiment of the present disclosure, provided is a non-transitory computer-readable recording medium storing a program that causes a computer to perform a process of performing a cycle a predetermined number of times to form a thin film composed of a specific element on a substrate in a processing chamber, the cycle including: supplying a first precursor containing the specific element and a halogen group to the substrate in the processing chamber to form a first layer containing the specific element and the halogen group; and supplying a second precursor containing the specific element and an amino group to the substrate in the processing chamber to modify the first layer to form a second layer, wherein in the process of performing the cycle the predetermined number of times, a temperature of the substrate is set such that a ligand containing the amino group is separated from the specific element in the second precursor, the separated ligand reacts with the halogen group in the first layer to remove the halogen group from the first layer, the separated ligand is prevented from being bonded to the specific element in the first layer, and the specific element from which the ligand is separated in the second precursor is bonded to the specific element in the first layer.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Hereinafter, embodiments of the present disclosure will be described in detail with reference to the drawings.

(1) Configuration of Substrate Processing Apparatus

Figure 1:
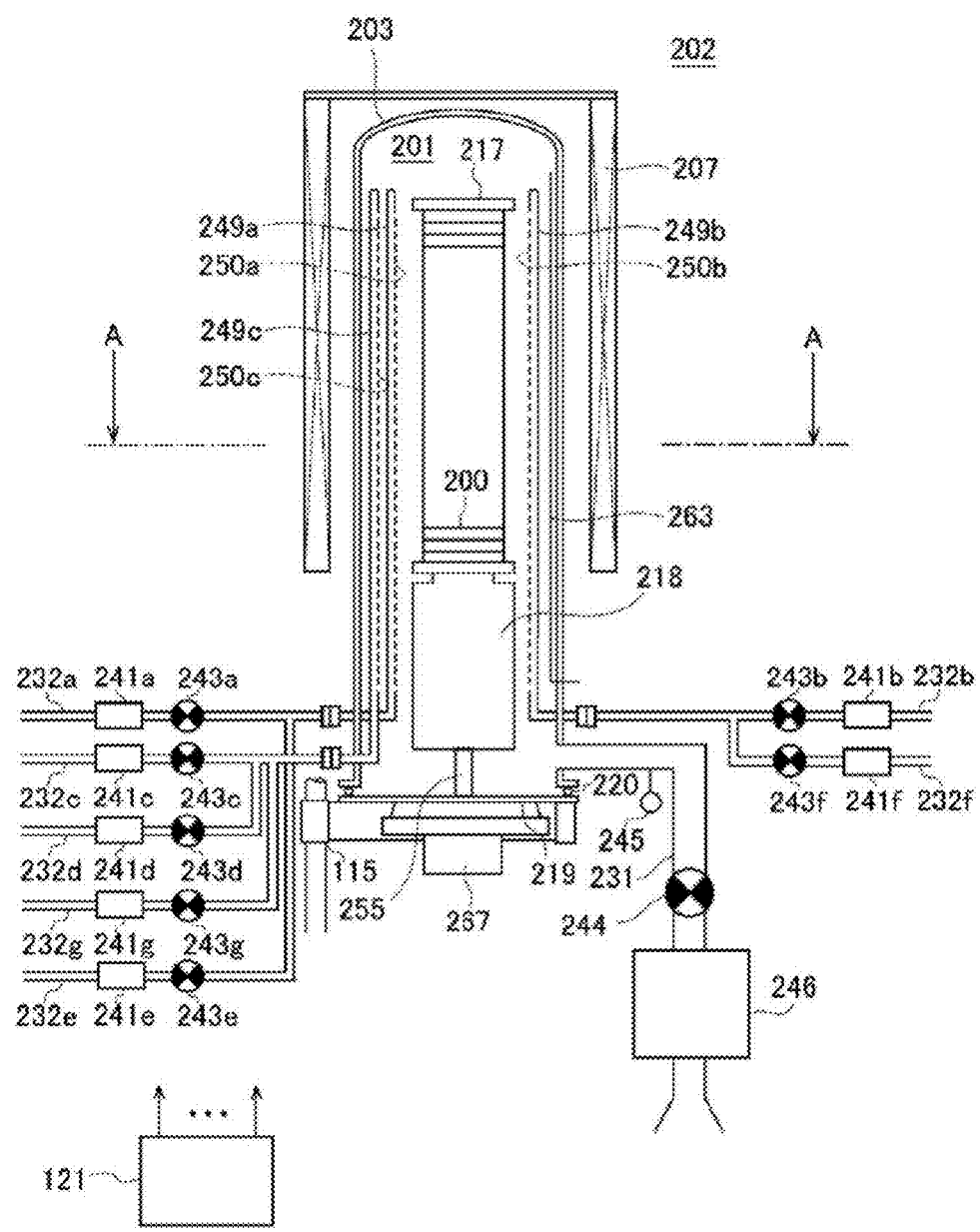
FIG. 1 is a schematic view illustrating a configuration of a vertical treatment furnace of a substrate processing apparatus, in which a portion of the treatment furnace is shown in a longitudinal sectional view, according to some embodiments.
Figure 2:
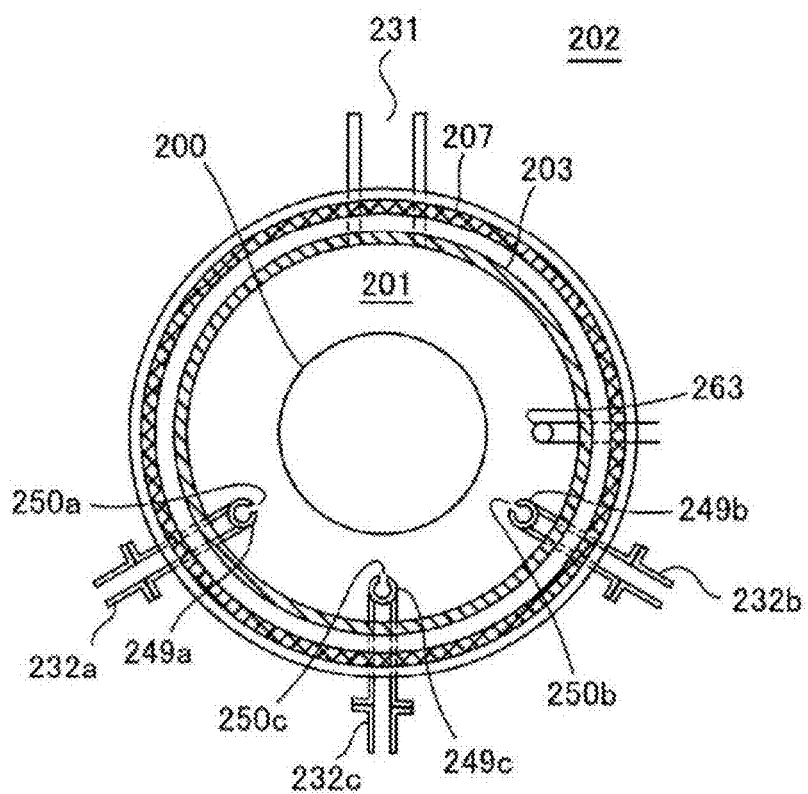
FIG. 2 is a schematic view illustrating a configuration of the vertical treatment furnace of the substrate processing apparatus, in which a portion of the treatment furnace is shown in a sectional view taken along line A-A in FIG. 1.

FIG. 1 is a schematic view illustrating a configuration of a vertical treatment furnace 202 of a substrate processing apparatus, according to some embodiments, in which a portion of the treatment furnace 202 is shown in a longitudinal sectional view. FIG. 2 is a schematic view illustrating a configuration of the vertical treatment furnace 202, according to some embodiments, in which a portion of the treatment furnace 202 is shown in a sectional view taken along line A-A in FIG. 1. The present disclosure is not limited to the substrate processing apparatus of FIGS. 1 and 2, and may be applied to a substrate processing apparatus, for example, including a single-wafer type, hot wall type, or cold wall type treatment furnace.

As illustrated in FIG. 1, the treatment furnace 202 includes a heater 207 as a heating means (a heating mechanism). The heater 207 has a cylindrical shape, and is vertically installed by being supported by a heater base (not shown) that is a holding plate. Also, as described later, the heater 207 may function as an activating mechanism that activates (excites) a gas with heat.

A reaction tube 203 configuring a reaction vessel (a processing vessel) is disposed inside the heater 207 in a concentric form along the heater 207. The reaction tube 203 may be formed of, for example, a heat-resistant material such as quartz ($SiO_2$) or silicon carbide (SiC) and has a cylindrical shape with an upper end closed and a lower end opened. A processing chamber 201 is provided in a hollow cylindrical portion of the reaction tube 203 and configured to accommodate a plurality of wafers 200, which are substrates. The wafers 200 are horizontally stacked in multiple stages to be aligned in a vertical direction in a boat 217 which will be described later.

A first nozzle 249a, a second nozzle 249b, and a third nozzle 249c are installed in the processing chamber 201 to pass through a lower portion of the reaction tube 203. A first gas supply pipe 232a, a second gas supply pipe 232b, and a third gas supply pipe 232c are connected to the first nozzle 249a, the second nozzle 249b, and the third nozzle 249c, respectively. In addition, a fourth gas supply pipe 232d is connected to the third gas supply pipe 232c. As described above, the three nozzles 249a, 249b and 249c and the four gas supply pipes 232a, 232b, 232c and 232d are installed in the reaction tube 203 to supply a plural kinds of (4 in this example) gases into the processing chamber 201.

Moreover, a manifold (not shown) formed of metal which supports the reaction tube 203 may be installed under the reaction tube 203 such that the nozzles pass through a sidewall of the manifold formed of metal. In this case, an exhaust pipe 231 described later may be installed at the manifold formed of metal. In this case, the exhaust pipe 231 may be installed at a lower portion of the reaction tube 203 rather than at the metal manifold. As described above, a furnace port of the treatment furnace 202 may be formed of metal, and the nozzles may be mounted on the furnace port formed of metal.

A mass flow controller (MFC) 241a, which is a flow rate controller (a flow rate control part), and a valve 243a, which is an opening/closing valve, are installed at the first gas supply pipe 232a in this order from an upstream direction. Also, a first inert gas supply pipe 232e is connected to the first gas supply pipe 232a at a downstream side of the valve 243a. A mass flow controller 241e, which is a flow rate controller (a flow rate control part), and a valve 243e, which is an opening/closing valve, are installed at the first inert gas supply pipe 232e in this order from the upstream direction. In addition, the above-described first nozzle 249a is connected to a front end of the first gas supply pipe 232a. The first nozzle 249a is installed in an arc-shaped space between an inner wall of the reaction tube 203 and the wafers 200.

The first nozzle 249a is vertically disposed along the inner wall of the reaction tube 203 to rise upward in a stacking direction of the wafers 200. That is, the first nozzle 249a is installed in a flank of a wafer arrangement region, in which the wafers 200 are arranged. The first nozzle 249a is configured as an L-shaped long nozzle with a horizontal portion installed to pass through a lower sidewall of the reaction tube 203 and a vertical portion installed to rise from one end to the other end of the wafer arrangement region. A plurality of gas supply holes 250a through which gas is supplied is formed at a side surface of the first nozzle 249a. The gas supply holes 250a are opened toward a center of the reaction tube 203 so that gas can be supplied toward the wafers 200. The gas supply holes 250a are disposed to span from a lower portion to an upper portion of the reaction tube 203 at a predetermined opening pitch. The plurality of gas supply holes 250a has the same opening area. A first gas supply system is mainly configured by the first gas supply pipe 232a, the mass flow controller 241a, and the valve 243a. Also, the first nozzle 249a may be included in the first gas supply system. In addition, a first inert gas supply system is mainly configured by the first inert gas supply pipe 232e, the mass flow controller 241e, and the valve 243e. The first inert gas supply system functions as a purge gas supply system.

A mass flow controller (MFC) 241b, which is a flow rate controller (a flow rate control part), and a valve 243b, which is an opening/closing valve, are installed at the second gas supply pipe 232b in this order from the upstream direction. Also, a second inert gas supply pipe 232f is connected to the second gas supply pipe 232b at a downstream side of the valve 243b. A mass flow controller 241f, which is a flow rate controller (a flow rate control part), and a valve 243f, which is an opening/closing valve, are installed at the second inert gas supply pipe 232f in this order from the upstream direction. In addition, the above-described second nozzle 249b is connected to a front end portion of the second gas supply pipe 232b. The second nozzle 249b is installed in an arc-shaped space between the inner wall of the reaction tube 203 and the wafers 200. The second nozzle 249b is vertically disposed along the inner wall of the reaction tube 203 to rise upward in the stacking direction of the wafers 200. That is, the second nozzle 249b is installed in the flank of the wafer arrangement region, in which the wafers 200 are arranged. The second nozzle 249b is configured as an L-shaped long nozzle and has a horizontal portion installed to pass through the lower sidewall of the reaction tube 203 and a vertical portion installed to rise from one end to the other end of the wafer arrangement region. A plurality of gas supply holes 250b through which gas is supplied is formed at a side surface of the second nozzle 249b. The gas supply holes 250b are opened toward the center of the reaction tube 203 so that gas can be supplied toward the wafers 200. The gas supply holes 250b are disposed to span from the lower portion to the upper portion of the reaction tube 203 at a predetermined opening pitch. The plurality of gas supply holes 250b has the same opening area. A second gas supply system is mainly configured by the second gas supply pipe 232b, the mass flow controller 241b, and the valve 243b. Also, the second nozzle 249b may be included in the second gas supply system. Furthermore, a second inert gas supply system is mainly configured by the second inert gas supply pipe 232f, the mass flow controller 241f, and the valve 243f. The second inert gas supply system functions as a purge gas supply system.

A mass flow controller (MFC) 241c, which is a flow rate controller (a flow rate control part), and a valve 243c, which is an opening/closing valve, are installed at the third gas supply pipe 232c in this order from the upstream direction. Also, a third inert gas supply pipe 232g is connected to the third gas supply pipe 232c at a downstream side of the valve 243c. A mass flow controller 241g, which is a flow rate controller (a flow rate control part), and a valve 243g, which is an opening/closing valve, are installed at the third gas supply pipe 232g in this order from the upstream direction. In addition, the above-described third nozzle 249c is connected to a front end portion of the third gas supply pipe 232c. The third nozzle 249c is installed in an arc-shaped space between the inner wall of the reaction tube 203 and the wafers 200. The third nozzle 249c is vertically disposed along the inner wall of the reaction tube 203 to rise upward in the stacking direction of the wafers 200. That is, the third nozzle 249c is installed at the flank of the wafer arrangement region, in which the wafers 200 are arranged. The third nozzle 249c is configured as an L-shaped long nozzle and has a horizontal portion installed to pass through the lower sidewall of the reaction tube 203 and a vertical portion installed to rise from one end to the other end of the wafer arrangement region. A plurality of gas supply holes 250c through which gas is supplied is formed at a side surface of the second nozzle 249b. The gas supply holes 250c are opened toward the center of the reaction tube 203 so that gas can be supplied toward the wafers 200. The gas supply holes 250c are disposed to span from the lower portion to the upper portion of the reaction tube 203 at a predetermined opening pitch. The plurality of gas supply holes 250c has the same opening area. A third gas supply system is mainly configured by the third gas supply pipe 232c, the mass flow controller 241c, and the valve 243c. In addition, the third nozzle 249c may be included in the third gas supply system. Furthermore, a third inert gas supply system is mainly configured by the third inert gas supply pipe 232g, the mass flow controller 241g and the valve 243g. The third inert gas supply system functions as a purge gas supply system.

Gas that is supplied may be transferred via the nozzles 249a, 249b and 249c disposed in an arc-shaped longitudinal space defined by the inner wall of the reaction tube 203 and end portions of the stacked wafers 200, the gas is first ejected into the reaction tube 203 near the wafers 200 through the gas supply holes 250a, 250b and 250c opened in the nozzles 249a, 249b and 249c, respectively. Thus, a main flow of the gas in the reaction tube 203 follows a direction parallel to surfaces of the wafers 200, namely, the horizontal direction. With this configuration, the gas can be uniformly supplied to the wafers 200, and a thickness of a thin film formed on each of the wafers 200 can be even throughout its surface. After reaction, a residual gas flows toward an exhaust port, for example, the exhaust pipe 231, but a direction of the residual gas flow is not limited to the vertical direction but may be appropriately specified by a position of the exhaust port.

As a first precursor containing a specific element and a halogen group, for example, a chlorosilane-based precursor gas containing at least a silicon (Si) element and a chloro group is supplied into the processing chamber 201 via the mass flow controller 241a, the valve 243a and the first nozzle 249a through the first gas supply pipe 232a. Here, the chlorosilane-based precursor refers to a silane-based precursor containing a chloro group, and includes at least silicon (Si) and chlorine (Cl). That is, the chlorosilane-based precursor described herein may be referred to as a kind of halide. Also, when the term "precursor" is used in the specification, it may refer to "a liquid precursor in a liquid state", "a precursor gas obtained by vaporizing a liquid precursor", or both. Accordingly, when the term "chlorosilane-based precursor" is used herein, it may refer to "a chlorosilane-based precursor in a liquid state", "a chlorosilane-based precursor gas", or both. For example, a hexachlorodisilane ($Si_2Cl_6$, abbreviation: HCDS) gas may be used as the chlorosilane-based precursor gas. In addition, when the liquid precursor (for example, HCDS) in a liquid state under a normal temperature and a normal pressure is used, the liquid precursor is vaporized by a vaporization system such as a vaporizer or a bubbler and supplied as a precursor gas (HCDS gas).

As a second precursor containing a specific element and an amino group (an amine group), for example, an aminosilane-based precursor gas containing at least a silicon (Si) element and the amino group is supplied into the processing chamber 201 via the mass flow controller 241b, the valve 243b and the second nozzle 249b through the second gas supply pipe 232b.

Here, the aminosilane-based precursor refers to a silane-based precursor (or a silane-based precursor containing an alkyl group such as a methyl group, a ethyl group, or a butyl group) containing the amino group and includes at least silicon (Si), carbon (C), and nitrogen (N). That is, the aminosilane-based precursor described herein may be referred to as an organic-based precursor, or referred to as an organic aminosilane-based precursor. Also, when the term "aminosilane-based precursor" is used in the specification, it may refer to "an aminosilane-based precursor in a liquid state", "an aminosilane-based precursor gas", or both of these. The aminosilane-based precursor may include, for example, monoaminosilane ($SiH_3R$) that is a precursor containing one amino group in a composition formula thereof (in its one molecule). Here, R represents a ligand. In this example, R is an amino group in which one or two hydrocarbon groups containing one or more carbon elements (C) are coordinated with one nitrogen element (N) (i.e., one or both of hydrogen elements (H) of an amino group represented by $NH_2$ are substituted by a hydrocarbon group containing one or more carbon elements (C)). If two hydrocarbon groups constituting a portion of the amino group are coordinated with one nitrogen element (N), the two hydrocarbon groups may be the same or different from each other. In addition, the hydrocarbon groups may include an unsaturated bond such as a double bond or a triple bond. In addition, the amino group may have a ring structure. Examples of $SiH_3R$ may include (ethylmethylamino) silane ($SiH_3[N(CH_3)(C_2H_5)]$), (dimethylamino) silane ($SiH_3[N(CH_3)_2]$), (diethylpiperidino.silane ($SiH_3[NC_5H_8)(C_2H_5)_2]$) and the like. When a liquefied precursor such as $SiH_3R$ in a liquid state at room temperature and atmospheric pressure is used, the liquefied precursor may be supplied as precursor ($SiH_3R$ gas) after being vaporized by a vaporizing system (not shown) such as a vaporizer or a bubbler.

As a third precursor containing a specific element, for example, a silane-based precursor gas (i.e., an inorganic silane-based precursor gas) that contains silicon (Si) without chlorine (CO, carbon (C), nitrogen (N), or oxygen (O) is supplied into the processing chamber 201 via the mass flow controller 241c, the valve 243c and the third nozzle 249c through the third gas supply pipe 232c. In this case, the inorganic silane-based precursor may refer to a silane-based precursor containing Cl, C, N, or O. The silane-based precursor gas (inorganic silane-based precursor gas) may include, for example, a monosilane ($SiH_4$) gas.

As a fourth precursor containing a specific element and an amino group (an amine group), for example, an aminosilane-based precursor gas containing at least a silicon (Si) element and the amino group is supplied into the processing chamber 201 via the mass flow controller 241d, the valve 243d, the third gas supply pipe 232c, and the third nozzle 249c through the fourth gas supply pipe 232d. Here, the aminosilane-based precursor may use, for example, a tris(dimethylamino) silane ($Si[N(CH_3)_2]_3H$, abbreviation: 3DMAS) gas that is a precursor gas containing a plurality of amino groups in a composition formula thereof (in its one molecule). In addition, when a liquid precursor (for example, 3DMAS) in a liquid state under a normal temperature and a normal pressure is used, the liquid precursor is vaporized by a vaporization system such as a vaporizer or a bubbler, and supplied as a precursor gas (3DMAS gas).

A nitrogen ($N_2$) gas, for example, is supplied from the inert gas supply pipes 232e, 232f and 232g into the processing chamber 201 through the mass flow controllers 241e, 241f and 241g, the valves 243e, 243f and 243f, the gas supply pipes 232a, 232b and 232c, the nozzles 249a, 249b and 249c, respectively.

Moreover, for example, when the above-described gases flow through the respective gas supply pipes, a first precursor supply system that supplies a first precursor containing a specific element and a halogen group, namely, a chlorosilane-based precursor gas supply system is configured by the first gas supply system. Here, the chlorosilane-based precursor gas supply system is simply referred to as a chlorosilane-based precursor supply system. Also, a second precursor supply system that supplies a second precursor containing a specific element and an amino group, namely, an aminosilane-based precursor gas supply system that is a second precursor gas supply system, is configured by the second gas supply system. Here, the aminosilane-based precursor gas supply system is simply referred to as an aminosilane-based precursor supply system. Also, a third precursor supply system that supplies a third precursor containing a specific element, namely, a silane-based precursor gas supply system (an inorganic silane-based precursor gas supply system) that is a third precursor gas supply system, is configured by the third gas supply system. Here, the silane-based precursor gas supply system (the inorganic silane-based precursor gas supply system) is simply referred to as a silane-based precursor supply system (the inorganic silane-based precursor supply system). Also, a fourth precursor supply system that supplies a fourth precursor containing a specific element and an amino group, namely, an aminosilane-based precursor gas supply system that is a fourth precursor gas supply system, is configured by the fourth gas supply system. Here, the aminosilane-based precursor gas supply system is simply referred to as an aminosilane-based precursor supply system.

The exhaust pipe 231 for exhausting an internal atmosphere in the processing chamber 201 is installed at the reaction tube 203. As illustrated in FIG. 2, when seen from a horizontal cross-sectional view, the exhaust pipe 231 is installed at a side of the reaction tube 203 opposite to a side of which the gas supply hole 250a of the first nozzle 249a, the gas supply hole 250b of the second nozzle 249b and the gas supply hole 250c of the third nozzle 249c are formed, namely, an opposite side of the gas supply holes 250a, 250b and 250c with the wafer 200 therebetween. In addition, as illustrated in FIG. 1, when seen from a vertical cross-sectional view, the exhaust pipe 231 is installed under a place in which the gas supply holes 250a, 250b and 250c are formed. According to the above-described configuration, the gas is supplied near the wafers 200 in the processing chamber 201 through the gas supply holes 250a, 250b and 250c. The supplied gas flows in the horizontal direction, namely, a direction parallel to the surfaces of the wafers 200, and then downward to be exhausted through the exhaust pipe 231. As described above, a main flow of the gas in the processing chamber 201 also becomes a flow in the horizontal direction.

A vacuum pump 246, which is a vacuum exhaust apparatus, is connected to the exhaust pipe 231 via a pressure sensor 245, which is a pressure detector (a pressure detection unit), configured to detect a pressure in the processing chamber 201, and an auto pressure controller (APC) valve 244, which regulate a pressure (a pressure regulating part). The APC valve 244 is a valve configured to carry out/stop vacuum exhaustion in the processing chamber 201 by opening/closing the valve with the vacuum pump 246 actuated. The APC valve 244 adjusts the internal pressure of the processing chamber 201 by regulating a degree of the valve opening with the vacuum pump 246 actuated. An exhaust system is mainly configured with the exhaust pipe 231, the APC valve 244 and the pressure sensor 245. In addition, the vacuum pump 246 may be included in the exhaust system. The exhaust system is configured to adjust a degree of valve opening of the APC valve 244 based on pressure information detected by the pressure sensor 245 while operating the vacuum pump 246. Thus, the pressure in the processing chamber 201 is vacuum-exhausted to a predetermined pressure (a vacuum level).

A seal cap 219, which functions as a furnace port cover for air-tightly sealing a lower end opening of the reaction tube 203, is installed under the reaction tube 203. The seal cap 219 is configured to contact a bottom of the reaction tube 203. The seal cap 219 is formed of metal such as stainless steel and has a disc shape. An O-ring 220, which is a seal member in contact with the bottom of the reaction tube 203, is installed at an upper surface of the seal cap 219. A rotary mechanism 267 for rotating the boat 217, which is a substrate holder described later, is installed below the seal cap 219. A rotary shaft 255 of the rotary mechanism 267 passes through the seal cap 219 for connection to the boat 217. The rotary mechanism 267 is configured to rotate the wafers 200 by rotating the boat 217. The seal cap 219 is configured to be raised and lowered in the vertical direction by a boat elevator 115, which is an elevation mechanism vertically installed at the outside of the reaction tube 203. The boat elevator 115 is configured to load and unload the boat 217 into and from the processing chamber 201 by raising and lowering the seal cap 219. That is, the boat elevator 115 is configured as a transfer apparatus (a transfer mechanism) configured to transfer the boat 217, namely, the wafers 200, into and from the processing chamber 201.

The boat 217, which is used as a substrate support, is formed of a heat-resistant material such as quartz or silicon carbide and configured to support the wafers 200 horizontally stacked in multiple stages with the center of the wafers 200 concentrically aligned. In addition, a heat insulating member 218 formed of a heat-resistant material such as quartz or silicon carbide is installed at a bottom of the boat 217 and configured such that heat from the heater 207 cannot be transferred to the seal cap 219. In addition, the heat insulating member 218 may be configured with a plurality of heat insulating plates formed of a heat-resistant material such as quartz or silicon carbide and a heat insulating plate holder configured to support the heat insulating plates in a horizontal posture in a multi-stage manner.

A temperature sensor 263 as a temperature detector is installed in the reaction tube 203. Based on temperature information detected by the temperature sensor 263, an electric conduction state to the heater 207 is adjusted such that the interior of the processing chamber 201 has an intended temperature distribution. The temperature sensor 263 is configured in an L-shape similarly to the nozzles 249a, 249b and 249c and installed along the inner wall of the reaction tube 203.

Figure 3:
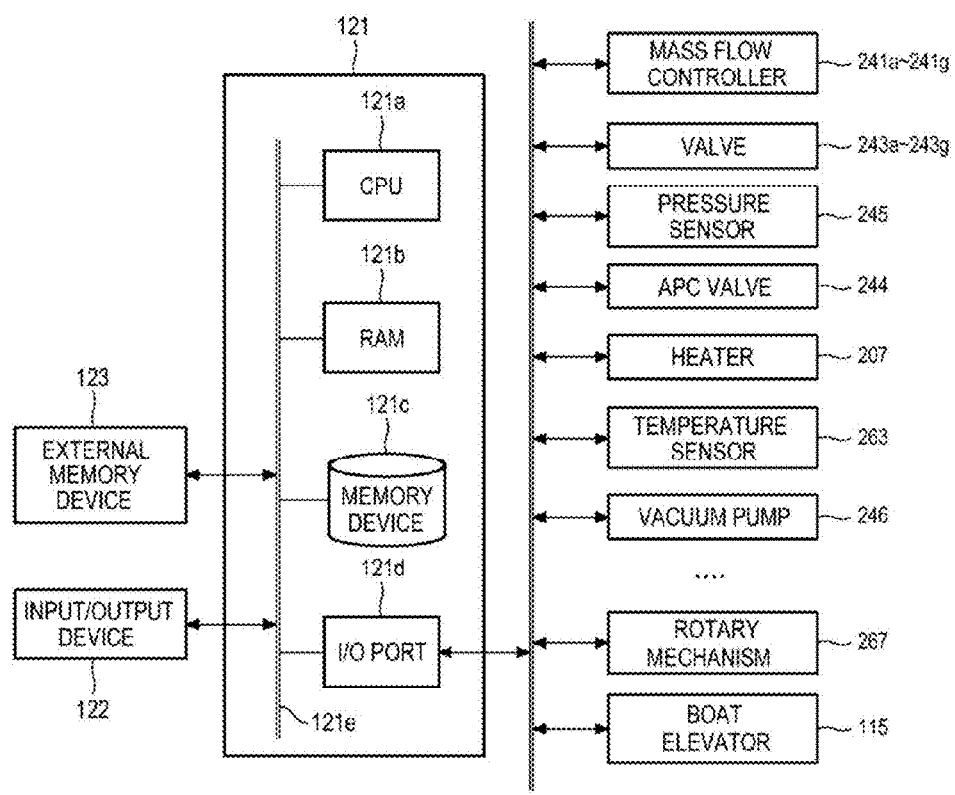
FIG. 3 is a block diagram illustrating a configuration of a controller of the substrate processing apparatus, according to some embodiments.

As illustrated in FIG. 3, a controller 121, which is a control unit (a control part), is configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a through an internal bus 121e. An input/output device 122 including, for example, a touch panel, is connected to the controller 121.

The memory device 121c is configured by, for example, a flash memory, a hard disk drive (HDD), or the like. A control program for controlling an operation of the substrate processing apparatus or a process recipe, in which a sequence or condition for processing a substrate described later is written, is readably stored in the memory device 121c. Also, the process recipe functions as a program to cause the controller 121 to execute each sequence in the substrate processing process described later to obtain a predetermined result. Hereinafter, the process recipe or control program may be generally referred to as a program. Also, when the term "program" is used herein, it may include a case in which only the process recipe is included, a case in which only the control program is included, or a case in which both the process recipe and the control program are included. In addition, the RAM 121b is configured as a memory area (a work area) in which a program or data read by the CPU 121a is temporarily stored.

The I/O port 121d is connected to the mass flow controllers 241a, 241b, 241c, 241d, 241e, 241f and 241g, the valves 243a, 243b, 243c, 243d, 243e, 243f and 243g, the pressure sensor 245, the APC valve 244, the vacuum pump 246, the heater 207, the temperature sensor 263, the rotary mechanism 267, and the boat elevator 115.

The CPU 121a is configured to read and execute the control program from the memory device 121c. According to input of an operation command from the input/output device 122, the CPU 121a reads the process recipe from the memory device 121c. In addition, the CPU 121a is configured to control flow rate controlling operations of various gases by the mass flow controllers 241a, 241b, 241c, 241d, 241e, 241f and 241g, opening/closing operations of the valves 243a, 243b, 243c, 243d, 243e, 243f and 243g, an opening/closing operation of the APC valve 244, a pressure regulating operation by the APC valve 244 based on the pressure sensor 245, a temperature regulating operation of the heater 207 based on the temperature sensor 263, start and stop of the vacuum pump 246, a rotation and rotation speed adjusting operation of the boat 217 by the rotary mechanism 267, an elevation operation of the boat 217 by the boat elevator 115, supply of power by the high-frequency power source 273, and an impedance adjusting operation of the matcher 272, according to contents of the read process recipe.

Moreover, the controller 121 is not limited to being configured as an exclusive computer but may be configured as a general-purpose computer. For example, the controller 121 may be configured by preparing an external memory device 123 (for example, a magnetic tape, a magnetic disk such as a flexible disk or a hard disk, an optical disk such as a CD or DVD, a magneto-optical disk such as an MO, a semiconductor memory such as a USB memory or a memory card), in which the program is stored, and installing the program on the general-purpose computer using the external memory device 123. Also, a means for supplying a program to a computer is not limited to the case in which the program is supplied through the external memory device 123. For example, the program may be supplied using a communication means such as the Internet or a dedicated line, rather than through the external memory device 123. Also, the memory device 121c or the external memory device 123 may be configured as a non-transitory computer-readable recording medium, which is readable by a computer. Hereinafter, these means for supplying the program will be simply referred to as a recording medium. In addition, when the term "recording medium" is used herein, it may include a case in which only the memory device 121c is included, a case in which only the external memory device 123 is included, or a case in which both the memory device 121c and the external memory device 123 are included.

(2) Substrate Processing Process

Figure 4:
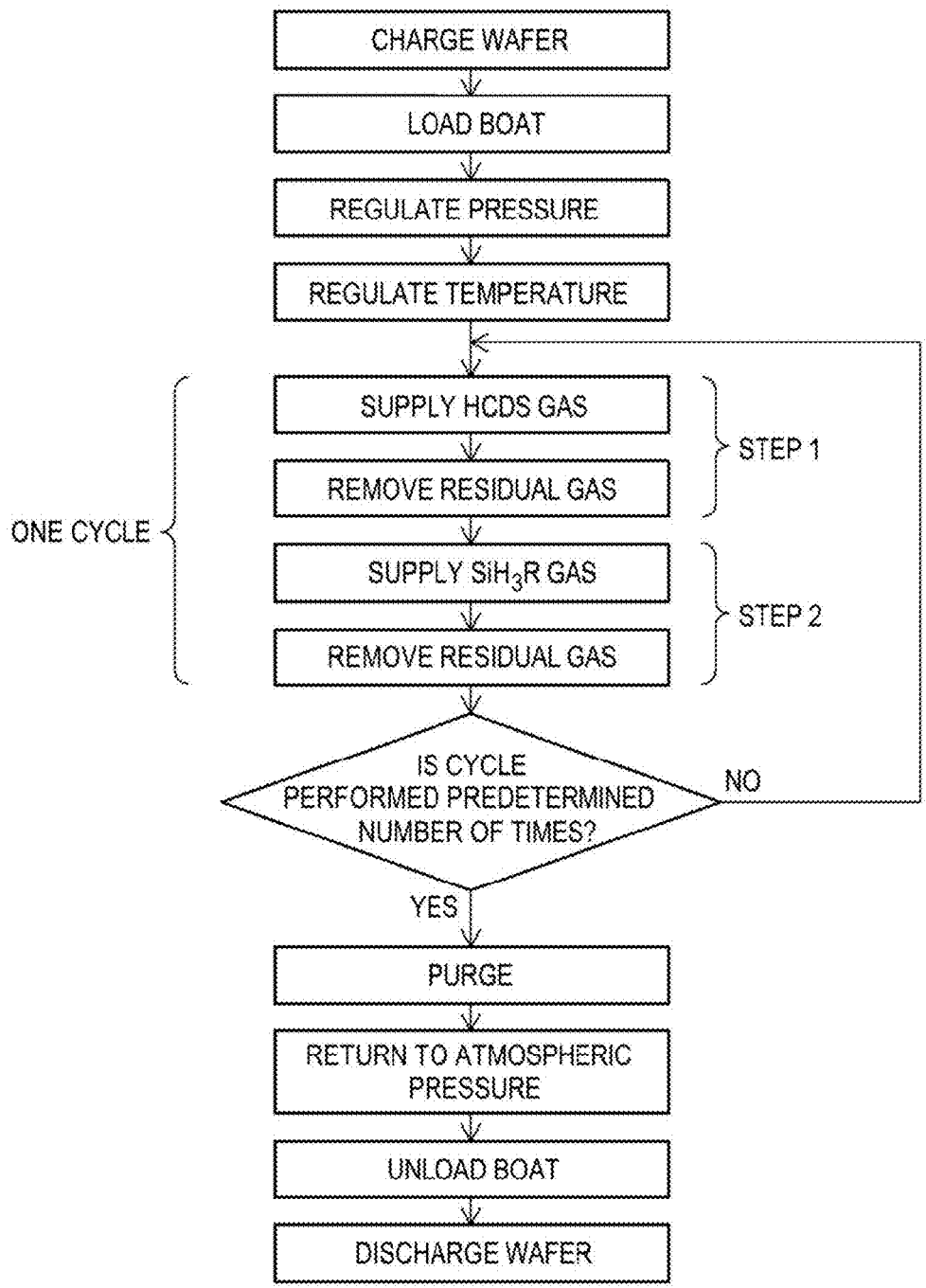
FIG. 4 is a flow chart illustrating a film-forming sequence, according to some embodiments.
Figure 5:
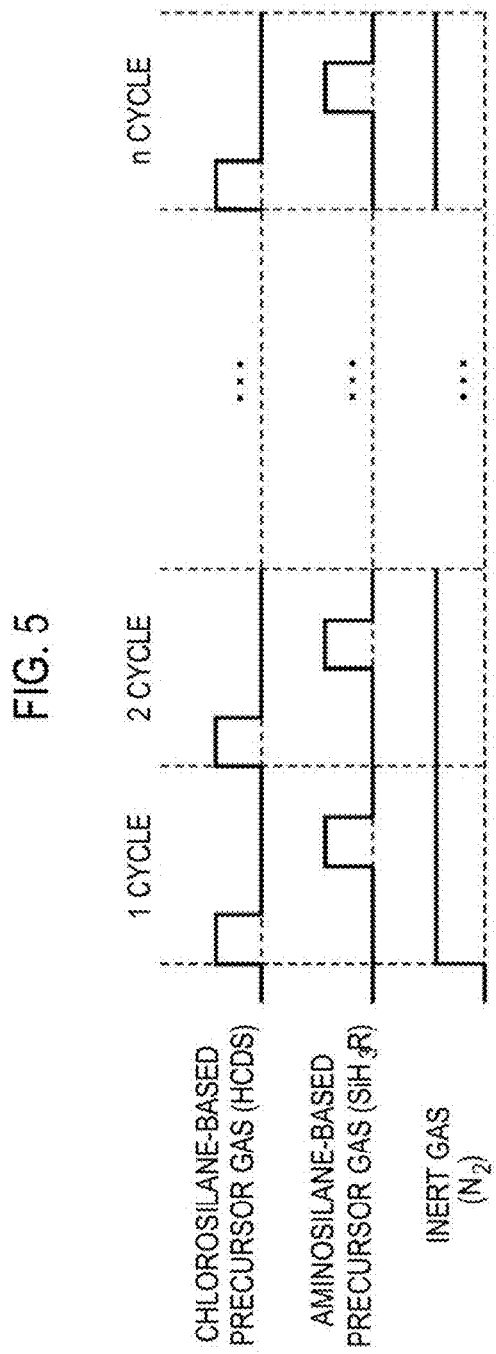
FIG. 5 is a gas supply timing diagram in the film-forming sequence, according to some embodiments.

Next, a sequence of forming a thin film on a substrate, which is one of the processes of manufacturing a semiconductor device by using the treatment furnace 202 of the above-described substrate processing apparatus, will be described with reference to FIGS. 4 and 5. FIG. 4 is a flow chart illustrating a film-forming sequence, according to some embodiments. FIG. 5 is a gas supply timing diagram in the film-forming sequence, according to some embodiments. In addition, in the following description, operations of the respective parts constituting the substrate processing apparatus are controlled by the controller 121.

In a film-forming sequence of the embodiment, a cycle is performed a predetermined number of times, the cycle including supplying a first precursor containing a specific element and a halogen group to a substrate to form a first layer containing the specific element and the halogen group and supplying a second precursor containing the specific element and an amino group to the substrate to modify the first layer to form a second layer.

In the act of performing the cycle the predetermined number of times, a temperature of the substrate is set such that a ligand containing the amino group is separated from the specific element in the second precursor, the separated ligand reacts with the halogen group in the first layer to remove the halogen group from the first layer, the separated ligand is prevented from being bonded to the specific element in the first layer, and the specific element from which the ligand is separated in the second precursor is bonded to the specific element in the first layer, and thus, a thin film composed of the specific element is formed on the substrate.

Specifically, the cycle may include supplying a chlorosilane-based precursor as the first precursor to the wafer 200 in the processing chamber 201 to form a silicon-containing layer containing chlorine as the first layer containing silicon and a chloro group (chlorine) and supplying an aminosilane-based precursor as the second precursor to the wafer 200 in the processing chamber 201 to modify the silicon-containing layer containing chlorine to form a silicon layer composed of silicon as the second layer.

In the act of performing the cycle the predetermined number of times, a temperature of the wafer 200 is set such that a ligand containing the amino group is separated from silicon in the aminosilane-based precursor, the separated ligand reacts with chlorine in the silicon-containing layer containing chlorine to remove chlorine from the silicon-containing layer containing chlorine, the separated ligand is prevented from being bonded to silicon in the silicon-containing layer from which chlorine is removed, and the silicon from which the ligand is separated in the aminosilane-based precursor is bonded to silicon in the silicon-containing layer from which chlorine is removed, and thus, a silicon film composed of silicon is formed on the wafer 200.

Here, the phrase "the cycle including forming the first layer and forming the second layer is performed a predetermined number of times" includes both of a case of performing the cycle once and a case of performing the cycle a plurality of times. That is, this means that the cycle is performed one or more times (a predetermined number of times).

Hereinafter, a film-forming sequence of the embodiment will be described in detail. In the embodiment, an example will be described in which an HCDS gas is used as the chlorosilane-based precursor gas, an $SiH_3R$ gas is used as the aminosilane-based precursor gas, and a silicon film (a Si film) composed of silicon is formed on the wafer 200 by the film-forming flow of FIG. 4 and the film-forming sequence of FIG. 5.

In addition, when the term "wafer" is used herein, it may refer to "the wafer itself" or "the wafer and a stacked body (a collected body) of predetermined layers or films formed on the surface" (i.e., the wafer including the predetermined layers or films formed on the surface may be referred to as a wafer). In addition, the phrase "a surface of a wafer" as used herein may refer to "a surface (an exposed surface) of a wafer itself" or "a surface of a predetermined layer or film formed on the wafer, namely, the uppermost surface of the wafer, which is a stacked body."

Accordingly, when "a predetermined gas is supplied to a wafer" is written herein, it may mean that "a predetermined gas is directly supplied to a surface (an exposed surface) of a wafer itself" or that "a predetermined gas is supplied to a layer or a film formed on a wafer, namely, on the uppermost surface of a wafer as a stacked body." Also, when "a predetermined layer (or a film) is formed on a wafer" is written herein, it may mean that "a predetermined layer (or a film) is directly formed on a surface (an exposed surface) of a wafer itself" or that "a predetermined layer (or a film) is formed on a layer or a film formed on a wafer, namely, on the uppermost surface of a wafer as a stacked body."

Moreover, the term "substrate" as used herein may be equivalent with the term "wafer", and in this case, the terms "wafer" and "substrate" may be used interchangeably.

(Wafer Charge and Boat Load)

When the plurality of wafers 200 are charged on the boat 217 (wafer charging), as illustrated in FIG. 1, the boat 217 supporting the plurality of wafers 200 is raised by the boat elevator 115 to be loaded into the processing chamber 201 (boat loading). In this state, the seal cap 219 seals the lower end of the reaction tube 203 via the O-ring 220.

(Pressure Adjustment and Temperature Adjustment)

The interior of the processing chamber 201 is vacuum-exhausted by the vacuum pump 246 to a desired pressure (a vacuum level). Here, the pressure in the processing chamber 201 is measured by the pressure sensor 245, and the APC valve 244 is feedback-controlled based on the measured pressure information (pressure adjustment). Also, the vacuum pump 246 maintains a regular operation state at least until processing of the wafers 200 is terminated. Further, the processing chamber 201 is heated by the heater 207 to a desired temperature. Here, an electrical conduction to the heater 207 is feedback-controlled based on the temperature information detected by the temperature sensor 263 until the interior of the processing chamber 201 reaches a desired temperature distribution (temperature adjustment). In addition, heating the interior of the processing chamber 201 by the heater 207 is carried out without interruption at least until processing of the wafers 200 is terminated. Next, the boat 217 and the wafers 200 begin to be rotated by the rotary mechanism 267 (wafer rotation). Furthermore, rotation of the boat 217 and the wafers 200 by the rotary mechanism 267 is carried out without interruption at least until processing of the wafers 200 is terminated.

(Process of Forming Silicon Film)

Subsequently, the following two steps, namely, Steps 1 and 2, are sequentially executed.

[Step 1]

(HCDS Gas Supply)

The valve 243a of the first gas supply pipe 232a is opened to flow HCDS gas in the first gas supply pipe 232a. A flow rate of the HCDS gas flowing in the first gas supply pipe 232a is regulated by the mass flow controller 241a. The flow rate-regulated HCDS gas is supplied into the processing chamber 201 through the gas supply hole 250a of the first nozzle 249a, and exhausted through the exhaust pipe 231. At this time, the HCDS gas is supplied to the wafer 200. At the same time, the valve 243e is opened to flow an inert gas such as an $N_2$ gas into the first inert gas supply pipe 232e. A flow rate of the $N_2$ gas flowing in the first inert gas supply pipe 232e is regulated by the mass flow controller 241e. The flow rate-regulated $N_2$ gas is supplied into the processing chamber 201 with the HCDS gas, and exhausted through the exhaust pipe 231. Additionally, in order to prevent infiltration of the HCDS gas into the second nozzle 249b and the third nozzle 249c, the valves 243f and 243g are opened to flow the $N_2$ gas into the second inert gas supply pipe 232f and the third inert gas supply pipe 232g, respectively. The $N_2$ gas is supplied into the processing chamber 201 via the second nozzle 249b through the second gas supply pipe 232b and via the third nozzle 249c, through the third gas supply pipe 232c and exhausted through the exhaust pipe 231.

At this time, the APC valve 244 is appropriately adjusted to change an internal pressure of the processing chamber 201 to fall within a range of, for example, 1 to 13,300 Pa, or more specifically, for example, 20 to 1,330 Pa. A supply flow rate of the HCDS gas controlled by the mass flow controller 241a is set to fall within a range of, for example, 1 to 1,000 sccm. Supply flow rates of the $N_2$ gas controlled by the mass flow controllers 241e, 241f and 241g are set to fall within a range of, for example, 100 to 10,000 sccm. A time period during which the HCDS gas is supplied to the wafer 200, namely, a gas supply time (an irradiation time), is set to fall within a range of, for example, 1 to 120 seconds, or more specifically, for example, 1 to 60 seconds.

In this case, when the temperature of the wafer 200 is less than 250 degrees C., it becomes difficult for the HCDS gas to be adsorbed onto the wafer 200. Consequently, a practical deposition rate cannot be obtained. This problem can be solved by setting the temperature of the wafer 200 to 250 degrees or more. Also, the HCDS gas can be more sufficiently adsorbed onto the wafer 200 by setting the temperature of the wafer 200 to 300 degrees C. or more, and a more sufficient deposition rate can be obtained. However, when the temperature of the wafer 200 exceeds 700 degrees C., a CVD reaction is strengthened (i.e., a gaseous reaction becomes dominant) and uniformity in a film thickness may be easily disturbed. By regulating the temperature of the wafer 200 to 700 degrees C. or less, the uniformity in film thickness can be maintained and controlled. In particular, by setting the temperature of the wafer 200 to 650 degrees C. or less, more specifically, for example, 600 degrees C. or less, a surface reaction becomes dominant, and the film thickness uniformity can be easily secured and controlled. When the temperature of the wafer 200 is set to fall within a range of, for example, 250 to 700 degrees C., more specifically, for example, 300 to 650 degrees C., or further more specifically, for example, 350 to 600 degrees C., it is possible to perform processing (i.e., forming the first layer described later) in Step 1.

Although details will be described later, when the temperature of the wafer 200 is less than 300 degrees C., it becomes difficult to perform a modification reaction (a modification reaction of the first layer) in Step 2 described later. By setting the temperature of the wafer 200 to 300 degrees C. or more, it becomes easy to perform the modification reaction in Step 2. Also, by setting the temperature of the wafer 200 to 350 degrees C. or more, the modification reaction in Step 2 becomes more active. However, when the temperature of the wafer 200 exceeds 450 degrees C., it becomes difficult to appropriately perform the modification reaction in Step 2. That is, in order to efficiently and appropriately perform processing in Step 2, it is required to set the temperature of the wafer 200 to fall within a range of, for example, 300 to 450 degrees C., or more specifically, for example, 350 to 450 degrees C.

As described above, a suitable temperature condition in Step 1 differs from that in Step 2, and a temperature range suitable to perform the processing in Step 1 includes a temperature range suitable to perform the processing in Step 2. Here, in order to enhance a throughput of a silicon film forming process in which a cycle including both Steps 1 and 2 is performed a predetermined number of times, the temperature of the wafer 200 in Step 1 and Step 2 may be set to the same temperature condition. That is, the temperature condition of the wafer 200 in Step 1 may be set identically to that of the wafer 200 in Step 2. Therefore, in Step 1, the temperature of the wafer 200 may be set to fall within a range of, for example, 300 to 450 degrees C., or more specifically, for example, 350 to 450 degrees C. At this temperature range, the processing (forming the first layer) in Step 1 and the modification processing (modifying the first layer) in Step 2 can be efficiently and appropriately performed, respectively.

Under the above-described conditions, by supplying the HCDS gas to the wafer 200, a silicon-containing layer containing chlorine (Cl) having a thickness of about less than one atomic layer to several atomic layers is formed as the first layer on the wafer 200. The silicon-containing layer containing Cl may be an adsorption layer of the HCDS gas, a silicon layer (a Si layer) containing Cl, or both.

Here, the silicon layer containing Cl is a generic name including a discontinuous layer in addition to a continuous layer formed of silicon (Si) and containing Cl or a silicon thin film containing Cl formed by laminating them. In addition, a continuous layer formed of Si and containing Cl may be referred to as the silicon thin film containing Cl. Further, Si constituting the silicon layer containing Cl contains Si, in which bonding to Cl is completely broken, in addition to Si in which bonding to Cl is not completely broken.

Moreover, the adsorption layer of the HCDS gas may include a chemisorption layer in which gas molecules of the HCDS gas are discontinuous, in addition to the chemisorption layer in which the gas molecules of the HCDS gas are continuous. That is, the adsorption layer of the HCDS gas may include a chemisorption layer that contains HCDS molecules having a thickness of one molecular layer or less.

Also, HCDS ($Si_2Cl_6$) molecules constituting the adsorption layer of the HCDS gas contains molecules in which bonding of Si and Cl is partially broken (a $Si_xCl_y$ molecule). That is, the adsorption layer of the HCDS gas includes a chemisorption layer in which $Si_2Cl_6$ molecules and/or $Si_xCl_y$ molecules are continuous or a chemisorption layer in which $Si_2Cl_6$ molecules and/or $Si_xCl_y$ molecules are discontinuous.

While a layer having a thickness of less than one atomic layer refers to a discontinuously formed atomic layer, a layer having a thickness of one atomic layer refers to a continuously formed atomic layer. Similarly, a layer having a thickness of less than one molecular layer refers to a discontinuously formed molecular layer while a layer having a thickness of one molecular layer refers to a continuously formed molecular layer.

Under conditions in which the HCDS gas is autolyzed (pyrolyzed), namely, under conditions in which a pyrolysis reaction of the HCDS gas occurs, the silicon layer containing Cl is formed by depositing Si on the wafer 200. Under conditions in which the HCDS gas is not autolyzed (pyrolyzed), namely, under conditions in which a pyrolysis reaction of the HCDS gas does not occur, the adsorption layer of the HCDS gas is formed by adsorbing the HCDS gas onto the wafer 200. In addition, formation of the silicon layer containing Cl on the wafer 200 results in higher a film-forming rate than formation of the adsorption layer of the HCDS gas on the wafer 200.

When the thickness of the silicon-containing layer containing Cl formed on the wafer 200 exceeds several atomic layers, an effect of the modification reaction in Step 2 described later is not transferred to the entire silicon-containing layer containing Cl. Because a minimum value of the thickness of the silicon-containing layer containing Cl that can be formed on the wafer 200 is less than one atomic layer, the thickness of the silicon-containing layer containing Cl may range from less than one atomic layer to several atomic layers. When the thickness of the silicon-containing layer containing Cl is one atomic layer or less, i.e., one atomic layer or less than one atomic layer, an effect of the modification reaction in Step 2 described later can be comparatively increased, and a time required for the modification reaction in Step 2 can be reduced. A time required for forming the silicon-containing layer containing Cl in Step 1 can also be reduced. Ultimately, a processing time per one cycle can be reduced, and a total processing time can also be reduced. That is, the film-forming rate can be increased. In addition, as the thickness of the silicon-containing layer containing Cl is one atomic layer or less, it may become easier to maintain and control the uniform film thickness.

(Residual Gas Removal)

After the silicon-containing layer containing Cl is formed, the valve 243a of the first gas supply pipe 232a is closed to stop the supply of the HCDS gas. At this time, the APC valve 244 of the exhaust pipe 231 is in an open state, and the interior of the processing chamber 201 is vacuum-exhausted by the vacuum pump 246 to remove unreacted HCDS gas, remaining in the processing chamber 201 after contributing to the formation of the first layer, from the processing chamber 201. Also, at this time, the valves 243e, 243f, and 243g are in an open state, and maintain the supply of the $N_2$ gas (inert gas) into the processing chamber 201. The $N_2$ gas acts as a purge gas. Thus, the unreacted HCDS gas, remaining in the processing chamber 201 after contributing to the formation of the first layer, can be more effectively removed from the inside of the processing chamber 201.

Moreover, in this case, the gas remaining in the processing chamber 201 may not be completely removed, and the interior of the processing chamber 201 may not be completely purged. When the gas remaining in the processing chamber 201 is very small in amount, there is no adverse effect generated in Step 2 performed thereafter. Here, an amount of the $N_2$ gas supplied into the processing chamber 201 need not be a large, and for example, approximately the same amount of the $N_2$ gas as the reaction tube 203 (the processing chamber 201) may be supplied to perform the purge such that there is no adverse effect generated in Step 2. As described above, as the interior of the processing chamber 201 is not completely purged, the purge time can be reduced to improve a throughput. In addition, consumption of the $N_2$ gas can be suppressed to a minimal necessity.

The chlorosilane-based precursor gas may use an inorganic precursor gas such as a tetrachlorosilane, namely, a silicon tetrachloride ($SiCl_4$, abbreviation: STC) gas, a trichlorosilane ($SiHCl_3$, abbreviation: TCS) gas, a dichlorosilane ($SiH_2Cl_2$, abbreviation: DCS) gas, monochlorosilane ($SiH_3Cl$, abbreviation: MCS) gas, a monosilane ($SiH_4$) gas, or the like, in addition to the hexachlorodisilane ($Si_2Cl_6$, abbreviation: HCDS) gas. The inert gas may include a rare gas such as an Ar gas, a He gas, a Ne gas, a Xe gas, or the like, in addition to the $N_2$ gas.

[Step 2]

($SiH_3R$ Gas Supply)

After Step 1 is terminated and the residual gas in the processing chamber 201 is removed, the valve 243b of the second gas supply pipe 232b is opened to flow the $SiH_3R$ gas in the second gas supply pipe 232b. A flow rate of the $SiH_3R$ gas flowing in the second gas supply pipe 232b is regulated by the mass flow controller 241b. The flow rate-regulated $SiH_3R$ gas is supplied into the processing chamber 201 through the gas supply holes 250b of the second nozzle 249b and exhausted through the exhaust pipe 231. At this time, the $SiH_3R$ gas is supplied to the wafer 200. At the same time, the valve 243f is opened to flow the $N_2$ gas (inert gas) into the second inert gas supply pipe 232f. A flow rate of the $N_2$ gas flowing in the second inert gas supply pipe 232f is regulated by the mass flow controller 241b, and the flow rate-regulated $N_2$ gas is supplied into the processing chamber 201 together with the $SiH_3R$ gas and exhausted through the exhaust pipe 231. Also, at this time, in order to prevent infiltration of the $SiH_3R$ gas into the first nozzle 249a and the third nozzle 249c, the valves 243e and 243g are opened to flow the $N_2$ gas into the first inert gas supply pipe 232e and the third inert gas supply pipe 232g. The $N_2$ gas is supplied into the processing chamber 201 via the first nozzle 249a through the first gas supply pipe 232a and via the third nozzle 249c through the third gas supply pipe 232c and exhausted through the exhaust pipe 231.

At this time, the APC valve 244 is appropriately adjusted to change the internal pressure of the processing chamber 201 to fall within a range of, for example, 1 to 13,300 Pa, or more specifically, for example, 20 to 1,330 Pa. A supply flow rate of the $SiH_3R$ gas controlled by the mass flow controller 241b is set to fall within a range of, for example, 1 to 1,000 sccm. Supply flow rates of the $N_2$ gas controlled by the mass flow controllers 241f, 241e and 241g are set to fall within a range of, for example, 100 to 10,000 sccm. A time period during which the $SiH_3R$ gas is supplied to the wafer 200, namely, a gas supply time (an irradiation time), is set to fall within a range of, for example, 1 to 120 seconds, or more specifically, for example, 1 to 60 seconds.

In this case, similarly to Step 1, a temperature of the heater 207 is set such that a temperature of the wafer 200 falls within a range of, for example, 300 to 450 degrees C., or more specifically, for example, 350 to 450 degrees C.

When the temperature of the wafer 200 is less than 300 degrees C., the SiH$_3$R gas supplied to the wafer 200 becomes difficult to autolyze (pyrolyze). Thus, a ligand (R) containing an amino group becomes difficult to be separated from silicon in the SiH$_3$R gas. That is, the number of ligands (R) reacting with the first layer (the silicon-containing layer containing Cl) formed in Step 1 becomes insufficient. As a result, a removal reaction of Cl from the first layer becomes difficult to occur.

When the temperature of the wafer 200 is set to 300 degrees C. or more, the SiH$_3$R gas supplied to the wafer 200 becomes easy to pyrolyze, and it becomes easy to separate the ligand (R) containing the amino group from silicon in the SiH$_3$R gas. Furthermore, the separated ligand (R) reacts with a halogen group (Cl) in the first layer. Thus, a removal reaction of Cl from the first layer becomes easy to occur. Also, when the temperature of the wafer 200 is set to 350 degrees C. or more, pyrolysis of the SiH$_3$R gas supplied to the wafer 200 become more active, thus, the number of ligands (R) separated from silicon in the SiH$_3$R gas can easily increase. As the number of ligands (R) reacting with Cl in the first layer increases, the removal reaction of Cl from the first layer becomes more active.

Moreover, thermal energy exceeding 450 degrees C. is necessary for bonding the ligand (R) containing the amino group, separated from silicon in the SiH$_3$R gas, to silicon in the first layer (the silicon-containing layer from which Cl is removed), namely, silicon (unpaired silicon) which has a dangling bond by separating Cl from the first layer or silicon (silicon which was not paired) which had dangling bond. Therefore, by setting the temperature of the wafer 200 to 450 degrees C. or less, the ligand (R) containing the amino group separated from silicon in the SiH$_3$R gas can be prevented from being bonded to unpaired silicon in the first layer (the silicon-containing layer from which Cl is removed) or silicon which was not paired. That is, by setting the temperature of the wafer 200 to 450 degrees C. or less, the ligand (R) containing the amino group can be prevented from being introduced into the first layer (the silicon-containing layer from which Cl is removed). As a result, an amount of impurities such as carbon (C) or nitrogen (N) can be considerably reduced in the first layer after modification, namely, the second layer described later.

Moreover, by setting the temperature of the wafer 200 to fall within the temperature range of 300 to 450 degrees C., silicon of the SiH$_3$R gas from which the ligand (R) is separated, namely, silicon (unpaired silicon) having a dangling bond included in the SiH$_3$R gas, is bonded to unpaired silicon in the first layer (the silicon-containing layer from which Cl is removed) or silicon which was not paired, thereby forming Si—Si bonding.

Moreover, when the temperature of the wafer 200 exceeds 450 degrees C., the ligand (R) containing the amino group separated from silicon in the SiH$_3$R gas can be easily bonded to unpaired silicon in the first layer (the silicon-containing layer from which Cl is removed) or silicon which was not paired. That is, the ligand (R) containing the amino group can be easily introduced into the first layer (the silicon-containing layer from which Cl is removed). Furthermore, an amount of impurities such as carbon (C) or nitrogen (N) can easily increase in the first layer after modification, namely, the second layer described later.

Therefore, the temperature of the wafer 200 may be set to fall within a range of, for example, 300 to 450 degrees C., or more specifically, for example, 350 to 450 degrees C.

Under the above-described conditions, by supplying the SiH$_3$R gas to the wafer 200, the SiH$_3$R gas reacts with the first layer (the silicon-containing layer containing Cl) which is formed on the wafer 200 in Step 1. That is, by supplying the SiH$_3$R gas to the wafer 200 heated at the above-described temperature, the ligand (R) containing the amino group is separated from silicon in the SiH$_3$R gas, and the separated ligand (R) reacts with Cl in the first layer to remove Cl from the first layer. Also, by heating the wafer 200 at the above-described temperature, the ligand (R) containing the amino group separated from silicon in the SiH$_3$R gas is prevented from being bonded to unpaired silicon in the first layer (silicon-containing layer from which Cl is removed) or silicon which was not paired. Moreover, unpaired silicon of the SiH$_3$R gas from which the ligand (R) is separated is bonded to unpaired silicon in the first layer (the silicon-containing layer from which Cl is removed) or silicon which was not paired, thereby forming Si—Si bonding. Therefore, the first layer (the silicon-containing layer containing Cl) formed on the wafer 200 in Step 1 is changed (modified) into the second layer which contains silicon and is very small in content of impurities such as chlorine (Cl), carbon (C), or nitrogen (N). In addition, the second layer has a thickness of about less than one atomic layer to several atomic layers, and is a silicon layer (Si layer) composed of silicon which is very small in content of impurities such as chlorine (Cl), carbon (C), or nitrogen (N). A crystalline structure of the Si layer has an amorphous state; thus, the Si layer may be referred to as an amorphous silicon layer (an a-Si layer).

Moreover, when the Si layer is formed as the second layer, Cl contained in the first layer before modification mostly reacts with the ligand (R) containing the amino group contained in the SiH$_3$R gas while the modification reaction of the first layer is performed by the SiH$_3$R gas, thereby generating, for example, a gaseous reaction byproduct such as amino salt, and the gaseous reaction byproduct is discharged from the processing chamber 201 through the exhaust pipe 231. Accordingly, an amount of impurities such as Cl, C, or N contained in the modified first layer, namely, the second layer, can be reduced. Also, when the SiH$_3$R gas is used as an aminosilane-based precursor gas, an amount of amino group contained in a composition formula thereof (in its one molecule) is small, namely, an amount of impurities such as C or N contained in the composition is small. Therefore an amount of impurities such as C or N contained in the modified first layer, namely, the second layer, can be easily reduced. In particular, an amount of N can be greatly reduced.

(Residual Gas Removal)

After the silicon layer is formed, the valve 243b of the second gas supply pipe 232b is closed to stop the supply of the SiH$_3$R gas. At this time, the APC valve 244 of the exhaust pipe 231 is in an open state, and the interior of the processing chamber 201 is vacuum-exhausted by the vacuum pump 246 to remove unreacted SiH$_3$R gas (or the SiH$_3$R gas which remains after contributing to the formation of the second layer) or reaction byproducts remaining in the processing chamber 201. Also, at this time, the valves 243f, 243e and 243g are in an open state and maintain the supply of the N$_2$ gas (inert gas) into the processing chamber 201. The N$_2$ gas acts as a purge gas; thus the unreacted SiH$_3$R gas (or the SiH$_3$R gas which remains after contributing to the formation of the second layer) or reaction byproducts, remaining in the processing chamber 201 can be more effectively removed from the inside of the processing chamber 201.

In this case, the gas remaining in the processing chamber 201 may not be completely removed, and the interior of the processing chamber 201 may not be completely purged. When the gas remaining in the processing chamber 201 is very small in amount, there is no adverse effect generated in Step 1 performed thereafter. Here, a flow rate of the $N_2$ gas supplied into the processing chamber 201 need not be a large flow rate, and for example, approximately the same volume of the $N_2$ gas as the reaction tube 203 (the processing chamber 201) may be supplied to perform the purge such that there is no adverse effect generated in Step 1. As described above, as the interior of the processing chamber 201 is not completely purged, the purge time can be reduced to improve a throughput. In addition, consumption of the $N_2$ gas can be suppressed to a minimal necessity.

Examples of the aminosilane-based precursor may include diaminosilane ($SiH_2RR'$), triaminosilane ($SiHRR'R''$), tetraminosilane ($SiRR'R''R'''$) and the like, in addition to the monoaminosilane ($SiH_3R$). Here, R, R', R", and R'" represent ligands. In this example, R, R', R", and R'" are amino groups in which one or two hydrocarbon groups containing one or more carbon elements (C) are coordinated with one nitrogen element (N) (i.e., one or both of hydrogen elements (H) of an amino group represented by $NH_2$ are substituted by a hydrocarbon group containing one or more carbon elements (C)). If two hydrocarbon groups constituting a portion of the amino groups are coordinated with one nitrogen element (N), the two hydrocarbon groups may be the same or different from each other. In addition, the hydrocarbon groups may include an unsaturated bond such as a double bond or a triple bond. In addition, R, R', R", and R'" may be the same amino group or different amino groups. In addition, the amino group may have a ring structure. Examples of $SiH_2RR'$ may include a bis(diethylamino)silane ($SiH_2[N(C_2H_5)_2]_2$, abbreviation: BDEAS), a bis(tertialbutylamino)silane ($SiH_2[NH(C_4H_9)]_2$, abbreviation: BTBAS), a bis(diethylpiperidino)silane ($SiH_2[NC_5H_8)(C_2H_5)_2]_2$, abbreviation: BDEPS) and the like. Examples of $SiHRR'R''$ may include a tris(diethylamino)silane ($SiH[N(C_2H_5)_2]_3$, abbreviation: 3DEAS), a tris(dimethylamino)silane ($SiH[N(CH_3)_2]_3$, abbreviation: 3DMAS) and the like. Examples of $SiRR'R''R'''$ may include a tetrakis(diethylamino)silane ($Si[N(C_2H_5)_2]_4$, abbreviation: 4DEAS), a tetrakis(dimethylamino)silane ($Si[N(CH_3)_2]_4$, abbreviation: 4DMAS) and the like.

Moreover, the aminosilane-based precursor may use an organic precursor in which the number of ligands containing an amino group in a composition formula thereof is two or less and the number of ligands containing a halogen group in a composition formula of the chlorosilane-based precursor is two or less.

For example, when the chlorosilane-based precursor uses HCDS ($Si_2Cl_6$), STC ($SiCl_4$), TCS ($SiHCl_3$), or DCS ($SiH_2Cl_2$) in which the number of ligands (Cl) containing a halogen group in a composition formula thereof is two or more, the aminosilane-based precursor may use diaminosilane ($SiH_2RR'$) in which the number of ligands (R) containing an amino group in a composition formula thereof is two, in addition to the monoaminosilane ($SiH_3R$) in which the number of ligands (R) containing an amino group in a composition formula thereof is one. In addition, when the chlorosilane-based precursor uses MCS ($SiH_3Cl$) in which the number of ligands (Cl) containing a halogen group in a composition formula thereof is one, the aminosilane-based precursor may use monoaminosilane ($SiH_3R$) in which the number of ligands (R) containing an amino group in a composition formula thereof is one.

Moreover, the number of ligands (R) containing the amino group in the composition formula of the aminosilane-based precursor may be less than the number of ligands (Cl) containing the halogen group in the composition formula of the chlorosilane-based precursor. Accordingly, when the chlorosilane-based precursor uses DCS in which the number of ligands (Cl) containing the halogen group in the composition formula is two, the aminosilane-based precursor may use monoaminosilane in which the number of ligands (R) containing the amino group in the composition formula is one, instead of the diaminosilane in which the number of ligands (R) containing the amino group in the composition formula is two.

Moreover, the number of ligands (R) containing the amino group in the composition formula of the aminosilane-based precursor may be one. Accordingly, the aminosilane-based precursor may use monoaminosilane instead of the diaminosilane. In this case, the chlorosilane-based precursor may use the HCDS, STC, TCS, or DCS in which the number of ligands (Cl) containing the halogen group in the composition formula is two or more, such that the number of ligands (R) containing the amino group in the composition formula of the aminosilane-based precursor becomes less than the number of ligands (Cl) containing the halogen group in the composition formula of the chlorosilane-based precursor.

Therefore, an amount of Cl contained in the first layer (the silicon-containing layer containing Cl) before modification is larger than an amount of the ligand (R) containing the amino group contained in the $SiH_3R$ gas supplied to the first layer (the silicon-containing layer containing Cl) in Step 2. In this case, the ligand (R) containing the amino group contained in the $SiH_3R$ gas mostly reacts with Cl contained in the first layer before modification, and generate, for example, a gaseous reaction byproduct such as amino salt during the modification reaction of the first layer. The gaseous reaction byproduct is discharged from the inside of the processing chamber 201 through the exhaust pipe 231. That is, the ligand (R) containing the amino group contained in the $SiH_3R$ gas is mostly discharged from the processing chamber 201 to thereby be removed without being introduced into the modified first layer, namely, the second layer. As a result, the modified first layer, namely, the second layer, may be changed (modified) into a silicon layer in which an amount of impurities, such as C or N, is very small.

The inert gas may include a rare gas such as an Ar gas, a He gas, a Ne gas, a Xe gas, or the like, in addition to the $N_2$ gas.

(Perform Predetermined Number of Times)

The above-described Steps 1 and 2 may be set as being included in one cycle, and the cycle may be performed one or more times (a predetermined number of times) to form the silicon film (the Si film) composed of silicon, which has a predetermined film thickness and in which an amount of impurities such as chlorine (Cl), carbon (C) or nitrogen (N) is very small, on the wafer 200. A crystalline structure of the Si film has an amorphous state, and the Si film may be referred to as an amorphous silicon film (the a-Si film). In addition, the above-described cycle may be performed multiple times. That is, a thickness of the Si film formed at every one cycle may be set to be smaller than a desired film thickness, and the cycle may be repeated multiple times until the desired film thickness is obtained.

Moreover, when the cycle is performed multiple times, the phrase "a predetermined gas is supplied to the wafer 200" in each step after at least two cycles means "a predetermined gas is supplied to a layer formed on the wafer 200, namely, the uppermost surface of the wafer 200, which is a stacked body," and the phrase "a predetermined layer is formed on the wafer 200" means "a predetermined layer is formed on a layer formed on the wafer 200, namely, the uppermost surface of the wafer 200, which is a stacked body." In addition, the above-described matters are similar in other film-forming sequences or modification examples described later.

(Purge and Return to Atmospheric Pressure)

When the film-forming process of forming the Si film having the predetermined film thickness is completed, the valves 243e, 243f and 243g are opened to supply the $N_2$ gas (inert gas) into the processing chamber 201 through the first inert gas supply pipe 232e, the second inert gas supply pipe 232f, and the third inert gas supply pipe 232g, and the $N_2$ gas is exhausted through the exhaust pipe 231. The $N_2$ gas acts as a purge gas, and thus, the interior of the processing chamber 201 is purged with the inert gas such that the unreacted gas or reaction byproducts remaining in the processing chamber 201 is removed from the processing chamber 201 (purge). Thereafter, an internal atmosphere of the processing chamber 201 is substituted with the inert gas (inert gas substitution), and the internal pressure of the processing chamber 201 returns to a normal pressure (return to an atmospheric pressure).

(Boat Unload and Wafer Discharge)

Afterwards, the seal cap 219 is lowered by the boat elevator 115 to open the bottom of the reaction tube 203, and the processed wafer 200 supported by the boat 217 is unloaded to the outside of the reaction tube 203 through the bottom of the reaction tube 203 (boat unload). Then, the processed wafer 200 is discharged by the boat 217 (wafer discharge).

(3) Effects According to the Operation of the Substrate Processing Apparatus of FIGS. 1 and 2

According to some embodiments, one or a plurality of effects are shown as described later.

When the cycle including Steps 1 and 2 is performed a predetermined number of times, the temperature of the wafer 200 is set such that the ligand containing the amino group is separated from silicon in the $SiH_3R$ gas, the separated ligand reacts with Cl in the first layer (the silicon-containing layer containing Cl) to remove Cl from the first layer, the separated ligand is prevented from being bonded to silicon in the first layer (the silicon-containing layer containing Cl), and silicon from which the ligand is separated in the $SiH_3R$ gas is bonded to silicon in the first layer (the silicon-containing layer containing Cl). Specifically, the temperature of the wafer 200 is set to fall within a range of, for example, 300 to 450 degrees C., or more specifically, for example, 350 to 450 degrees C.

Therefore, the first layer (the silicon-containing layer containing Cl) formed in Step 1 may be modified into the second layer (the Si layer) in which an amount of impurities such as Cl, C, or N is very small. Furthermore, by performing the cycle including Steps 1 and 2 the predetermined number of times, a high quality silicon film in which an amount of impurities such as Cl, C, or N is very small may be formed at a low temperature range. Also, performing the cycle including Steps 1 and 2 the predetermined number of times, when the temperature of the wafer 200 is set to a temperature exceeding 450 degrees C., may result in C having a concentration of 5% or more in the silicon film. By setting the temperature of the wafer 200 to fall within a range of, for example, 300 to 450 degrees C., or more specifically, for example, 350 to 450 degrees C., a high quality silicon film in which an amount of impurities is very small may be formed.

Moreover, the silicon film formed by the above-described film-forming method is, for example, a dense film having a high wet etching resistance to HF, and it can be, for example, appropriately used as an etching mask film when a base SiO film or the like is etched with HF. However, in this case, since the silicon film is not an insulating film such as a SiO film or a SiN film, the silicon film used as the etching mask film is required to be removed after performing an etching process.

Moreover, according to the film-forming sequence of the embodiment, in Step 2, the aminosilane-based precursor gas may include the $SiH_3R$ gas in which an amount of amino group contained in a composition formula thereof (in its one molecule) is small. Specifically, a precursor gas containing a single amino group in the composition formula (In its one molecule) may be used. Since the aminosilane-based precursor gas may include a precursor gas in which an amount of C or N contained in the composition is small, it becomes easy to decrease an amount of impurities such as C or N contained in the second layer which is formed in Step 2. Particularly, it becomes possible to greatly reduce an amount of N. In addition, it becomes easy to decrease an amount of impurities such as C or N contained in the silicon film, making it possible to greatly reduce an amount of N.

Moreover, according to the film-forming sequence of the embodiment, by using two precursors (silane sources) such as the chlorosilane-based precursor and the aminosilane-based precursor, the silicon film can be formed even at a low temperature range. Also, when only the chlorosilane-based precursor is used, it may be difficult to deposit silicon on a wafer at a film-forming rate satisfying a production efficiency at a temperature range equal to or less than 500 degrees C. A deposition of silicon on a wafer was not performed at the temperature range equal to or less than 500 degrees C. for the case when the aminosilane-based precursor is used alone. However, according to the method of the embodiment, it is possible to form a high quality silicon film at a film-forming rate satisfying a production efficiency even at a low temperature range equal to or less than 500 degrees C., for example, a temperature range of 300 to 400 degrees C.

Moreover, when a film-forming temperature is lowered, a reaction or desorption of chlorine contained in the chlorosilane-based precursor or amine contained in the aminosilane-based precursor generally becomes difficult to occur because molecules' kinetic energy is reduced and ligands of these remain on a surface of a wafer. Furthermore, since the residual ligands become a steric hindrance, an adsorption of silicon onto the surface of the wafer is hindered, and a silicon density is lowered causing a deterioration of a film. However, even under a condition in which the reaction or desorption is difficult to occur, by appropriately reacting two silane sources, namely, the chlorosilane-based precursor and the aminosilane-based precursor, it becomes possible to desorb the residual ligands of these. In addition, the steric hindrance is solved by the desorption of the residual ligands, and thus, it becomes possible to adsorb silicon onto the surface of the wafer, thereby increasing a silicon density. Accordingly, it is considered that a film having a high silicon density can be formed even at a low temperature range equal to or less than 500 degrees C., for example, a temperature zone of 300 to 400 degrees C.

Moreover, according to the embodiment, a high quality silicon film can be formed by a thermal reaction (a thermochemical reaction) under a non-plasma atmosphere (without using plasma) at a low temperature range. In addition, since the silicon film can be formed without using plasma, the present disclosure may be applied to a process in which there is a possibility of plasma damage.

Moreover, according to the embodiment, by using an alternate supply method that alternately supplies the chlorosilane-based precursor and the aminosilane-based precursor to the wafer 200, a reaction can be appropriately performed under a condition in which a surface reaction is dominant; thus, step coverage (step coverage characteristic) of the silicon film can be enhanced. In addition, controllability of a film thickness of the silicon film can be enhanced.

(4) Modification Examples

An example, which forms a silicon film of a predetermined film thickness on the wafer 200 by carrying out the cycle including Steps 1 and 2 the predetermined number of times, has been described above in the above-described film-forming sequence of FIGS. 4 and 5, but the film-forming sequence according to the embodiment may be varied as described later without being limited thereto.

Modification Example 1

Figure 6:
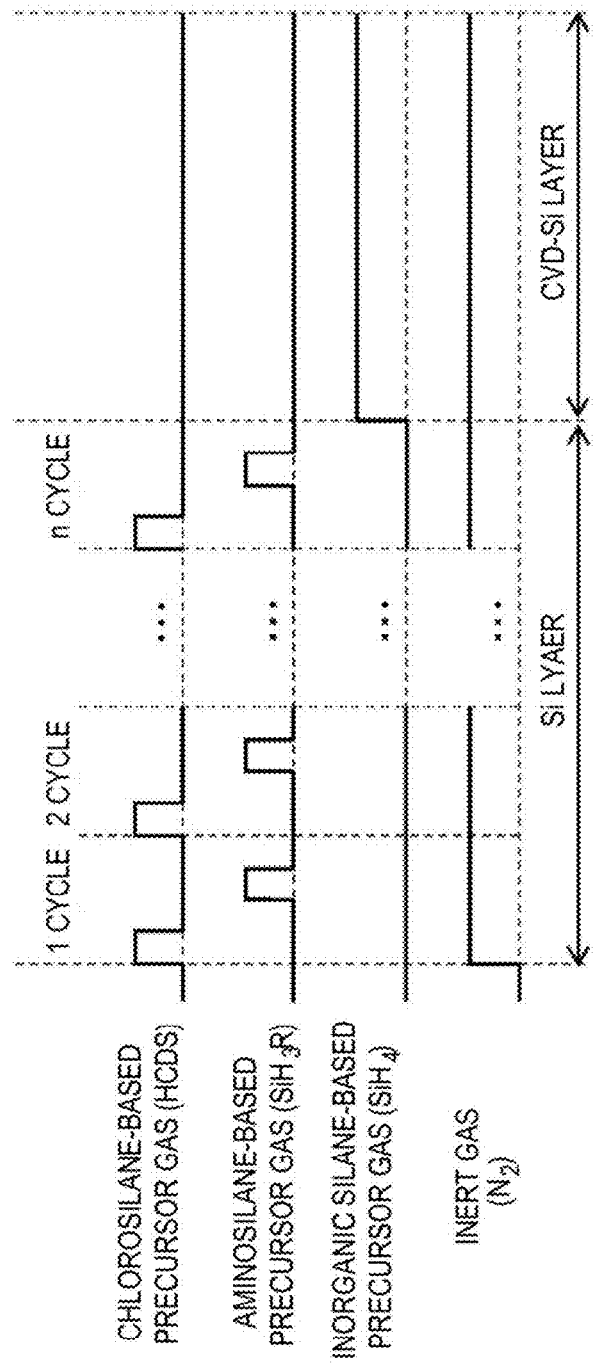
FIG. 6 is a view showing Modification Example 1 of the gas supply timing in the film-forming sequence, according to some embodiments.

For example, as shown in FIG. 6, a Si layer composed of Si in which an amount of impurities such as Cl, C, or N is very small is formed as an initial layer (seed layer) by performing the cycle including Steps 1 and 2 a predetermined number of times. Then an inorganic silane-based precursor gas (for example, a $SiH_4$ gas) is supplied to the wafer 200, thereby forming a CVD-Si layer by a chemical vapor deposition (CVD) method. Accordingly, the silicon film in which the Si layer and the CVD-Si layer are stacked on the wafer 200 may be formed.

In order to form the CVD-Si layer, the valve 243c of the third gas supply pipe 232c is opened to flow the $SiH_4$ gas in the third gas supply pipe 232c. A flow rate of the $SiH_4$ gas flowing in the third gas supply pipe 232c is regulated by the mass flow controller 241c. The flow rate-regulated $SiH_4$ gas is supplied into the processing chamber 201 through the gas supply holes 250c of the third nozzle 249c, and exhausted through the exhaust pipe 231. At this time, the $SiH_4$ gas is supplied to the wafer 200. At the same time, the valve 243g is opened to flow the $N_2$ gas (inert gas) into the inert gas supply pipe 232g. A flow rate of the $N_2$ gas flowing in the inert gas supply pipe 232g is regulated by the mass flow controller 241g. The flow rate-regulated $N_2$ gas is supplied into the processing chamber 201 together with the $SiH_4$ gas, and exhausted through the exhaust pipe 231. Also, at this time, in order to prevent infiltration of the $SiH_4$ gas into the first nozzle 249a and the second nozzle 249b, the valves 243e and 243f are opened to flow the $N_2$ gas into the first inert gas supply pipe 232e and the second inert gas supply pipe 232f, respectively. The $N_2$ gas is supplied into the processing chamber 201 through the first gas supply pipe 232a, the second gas supply pipe 232b, the first nozzle 249a, and the second nozzle 249b, and exhausted through the exhaust pipe 231.

At this time, the APC valve 244 is appropriately adjusted to change the internal pressure of the processing chamber 201 to fall within a range of, for example, 1 to 1,000 Pa. A supply flow rate of the $SiH_4$ gas controlled by the mass flow controller 241c is set to fall within a range of, for example, 1 to 1,000 sccm. Supply flow rates of the $N_2$ gas controlled by the mass flow controllers 241g, 241e, and 241f are set to fall within a range of, for example, 100 to 10,000 sccm. At this time, the temperature of the heater 207 is set such that a temperature of the wafer 200 falls within a range of, for example, 350 to 700 degrees C. By supplying the $SiH_4$ gas to the wafer 200 under the above-described conditions, the CVD-Si layer of a predetermined thickness is formed as the initial layer (seed layer) on the Si layer.

After the CVD-Si layer of the predetermined thickness is formed, the valve 243c of the third gas supply pipe 232c is closed to stop the supply of the $SiH_4$ gas. At this time, the APC valve 244 of the exhaust pipe 231 is in an open state. The interior of the processing chamber 201 is vacuum-exhausted from the processing chamber 201 by the vacuum pump 246. Unreacted $SiH_4$ gas, remaining in the processing chamber 201 after contributing to the formation of the CVD-Si layer, is removed during the vacuum-exhaustion. Also, at this time, the valves 243g, 243e and 243f are in an open state, maintaining the supply of the $N_2$ gas (inert gas) into the processing chamber 201. The $N_2$ gas acts as a purge gas, and thus the unreacted $SiH_4$ gas, remaining in the processing chamber 201 after contributing to the formation of the CVD-Si layer, can be more effectively removed from the processing chamber 201.

In this way, the silicon film in which the Si layer and the CVD-Si layer are stacked on the wafer 200 is formed. In addition, an amount of impurities such as Cl, C, or N is significantly reduced in the CVD-Si layer when using an inorganic silane-based precursor gas containing no Cl, C, or N as a precursor gas. That is, an amount of impurities such as Cl, C, or N is significantly reduced in the silicon film.

According to the example, the Si layer is previously formed as the initial layer (seed layer) on the wafer 200, thus enhancing an in-plane film thickness uniformity of a silicon film in a wafer. For example, when the silicon film is directly formed on the wafer by the CVD method, the in-plane film thickness uniformity of the silicon film in the wafer can be degraded because Si grows in an island shape at an initial stage of silicon growth. To solve such a problem, according to the modification example, the Si layer that is the initial layer can be formed to have a good step coverage by performing the cycle including Steps 1 and 2 a predetermined number of times. Therefore, Si can be prevented from growing in the island shape at a surface of the wafer at an initial film-forming stage of the silicon film and enhances the in-plane film thickness uniformity of the silicon film in the wafer. In addition, a deposition rate of the silicon film can be enhanced by using the CVD method.

Moreover, the inorganic silane-based precursor gas may use a polysilane ($Si_nH_{2n+2}$(n>2)) gas such as a disilane ($Si_2H_6$) gas, a trisilane ($Si_3H_8$) gas, or the like, in addition to the monosilane ($SiH_4$). Polysilane may be referred to as an inorganic silane-based precursor gas containing no chlorine. The inert gas may include a rare gas such as an Ar gas, a He gas, a Ne gas, a Xe gas, or the like, in addition to the $N_2$ gas.

Modification Example 2

Figure 7:
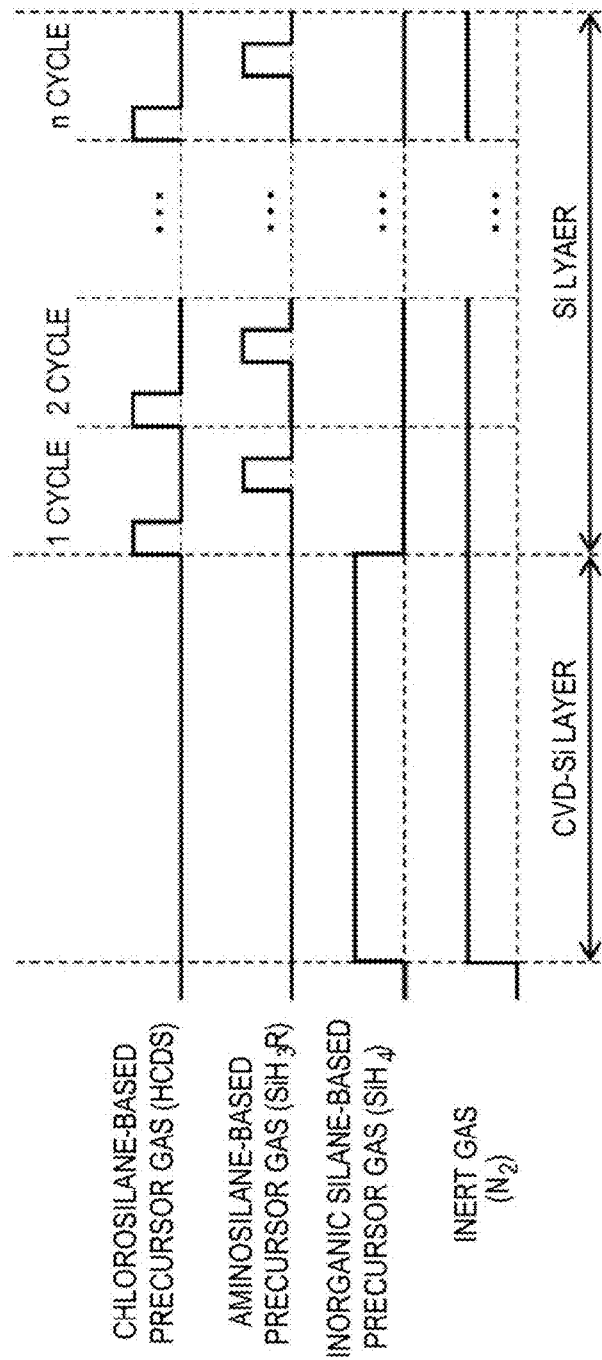
FIG. 7 is a view showing Modification Example 2 of the gas supply timing in the film-forming sequence, according to some embodiments.

Moreover, as shown in FIG. 7 for example, a CVD-Si layer may be formed using the inorganic silane-based precursor gas (for example, the $SiH_4$ gas) applying the CVD method. Then a Si layer in which an amount of impurities such as Cl, C, or N is very small may be formed by performing the cycle including Steps 1 and 2 of FIGS. 4 and 5 a predetermined number of times. Accordingly, a silicon film in which the CVD-Si layer and the Si layer are stacked on the wafer 200 may be formed.

Modification Example 3

Figure 8:
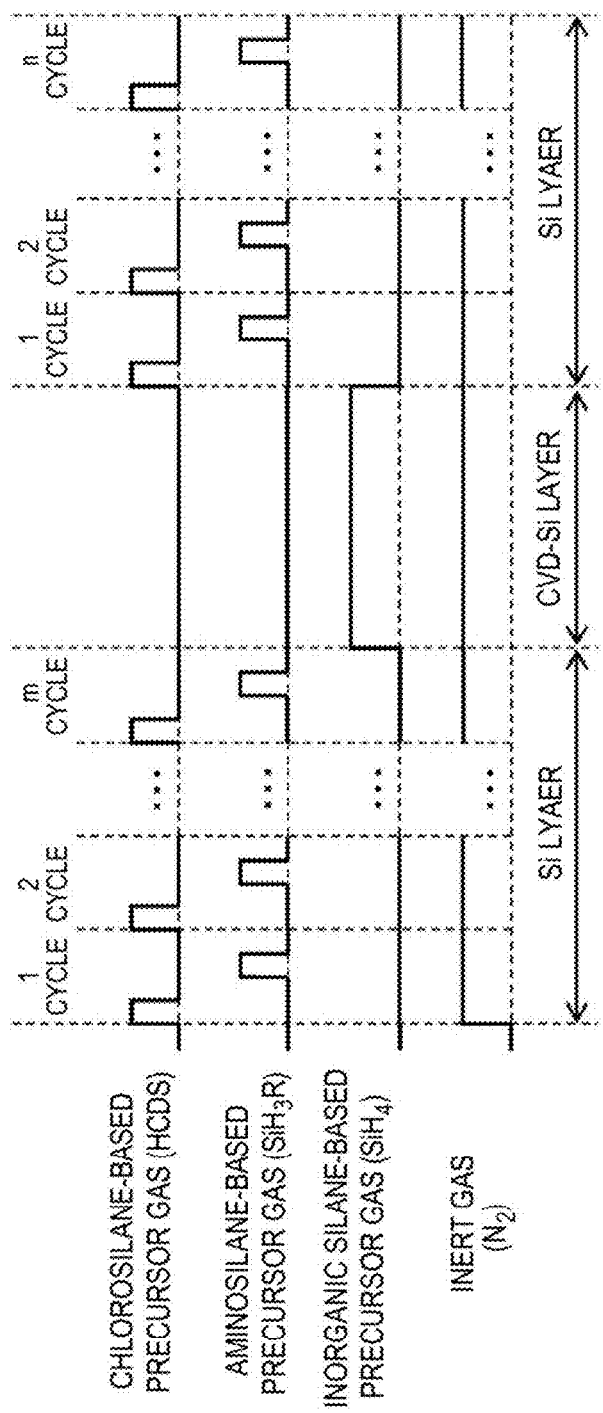
FIG. 8 is a view showing Modification Example 3 of the gas supply timing in the film-forming sequence, according to some embodiments.

Moreover, as shown in FIG. 8 for example, a Si layer in which an amount of impurities such as Cl, C, or N is very small may be formed as an initial layer (a seed layer) by performing the cycle including Steps 1 and 2 of FIGS. 4 and 5 a predetermined number of times (m times). A CVD-Si layer may be formed using the inorganic silane-based precursor gas (for example, the $SiH_4$ gas) using the CVD method. Then another Si layer in which an amount of impurities such as Cl, C, or N is very small may be formed by performing the cycle including Steps 1 and 2 of FIGS. 4 and 5 a predetermined number of times (n times). Accordingly, a silicon film in which the Si layer, the CVD-Si layer, and the other Si layer are stacked on the wafer 200 may be formed.

Modification Example 4

Figure 9:
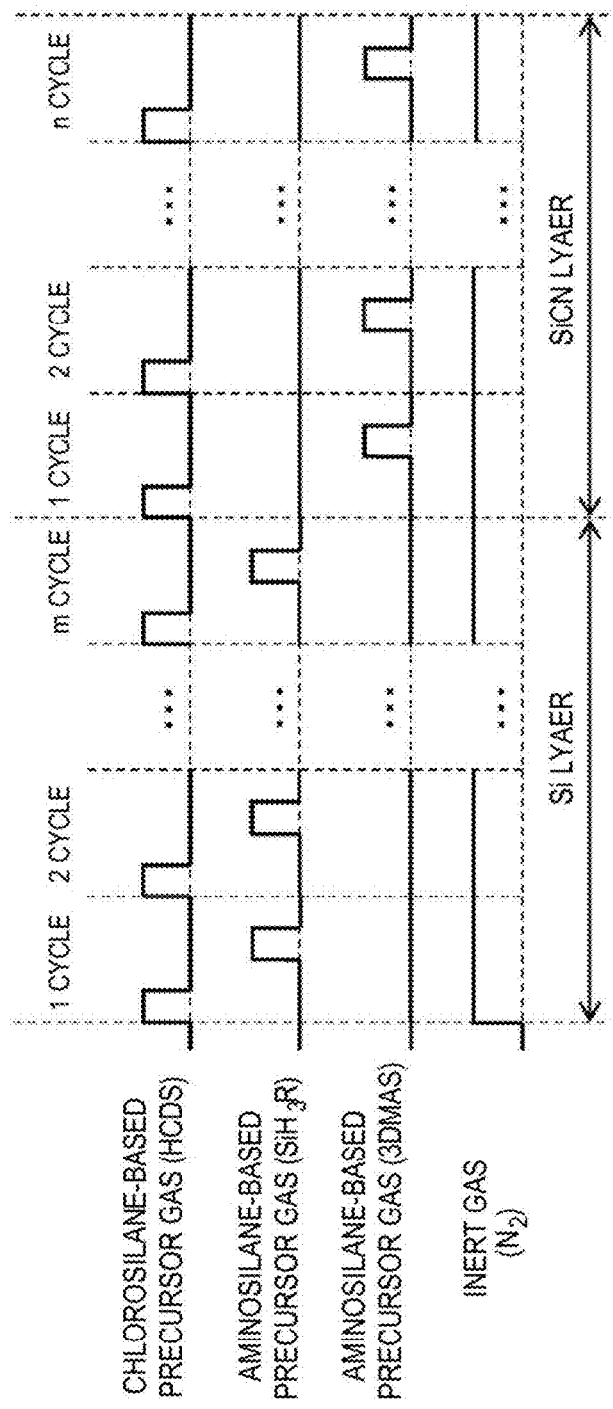
FIG. 9 is a view showing Modification Example 4 of the gas supply timing in the film-forming sequence, according to some embodiments.

Moreover, for example, as shown in FIG. 9, a Si layer in which an amount of impurities such as Cl, C, or N is very small may be formed as an initial layer (a seed layer) by performing the cycle including Steps 1 and 2 of FIGS. 4 and 5 a predetermined number of times (m times), and then a silicon carbon nitride layer (a SiCN layer) may be formed by performing a cycle a predetermined number of times (n times), the cycle including Step 3 that supplies a chlorosilane-based precursor gas (for example, an HCDS gas) to the wafer 200 and Step 4 that supplies an aminosilane-based precursor gas (for example, a 3DMAS gas) to the wafer 200. Accordingly, a stacked film in which the Si layer and the SiCN layer, namely, a silicon film (a Si film) and a silicon carbon nitride film (a SiCN film) are stacked on the wafer 200 may be formed. Hereinafter, Steps 3 and 4 will be described.

[Step 3]
(HCDS Gas Supply)

Step 3 that supplies the HCDS gas to the wafer 200 is performed in a sequence with processing conditions similar to those of Step 1 of the film-forming sequence of FIGS. 4 and 5. However, the temperature of the wafer 200 may be set to fall within a range of, for example, 250 to 700 degrees C., or more specifically, for example, 300 to 650 degrees C., or further more specifically, for example, 350 to 600 degrees C. Accordingly, for example, a Si-containing layer containing Cl which has a thickness of about less than one atomic layer to several atomic layers is formed on the Si layer formed on the wafer 200.

(Residual Gas Removal)

After the silicon-containing layer containing Cl is formed, unreacted HCDS gas remaining in the processing chamber 201 after contributing to the formation of the first layer or reaction byproduct is removed from the processing chamber 201 by a sequence and processing conditions of Step 1.

[Step 4]
(3DMAS Gas Supply)

After Step 3 is terminated and the residual gas in the processing chamber 201 is removed, the valve 243d of the fourth gas supply pipe 232d is opened to flow a 3DMAS gas in the fourth gas supply pipe 232d. A flow rate of the 3DMAS gas flowing in the fourth gas supply pipe 232d is regulated by the mass flow controller 241d. The flow rate-regulated 3DMAS gas is supplied into the processing chamber 201 through the gas supply holes 250d of the third nozzle 249c, and exhausted through the exhaust pipe 231. At this time, the 3DMAS gas is supplied to the wafer 200. At the same time, the valve 243g is opened to flow the $N_2$ gas (inert gas) into the inert gas supply pipe 232g. A flow rate of the $N_2$ gas flowing in the inert gas supply pipe 232g is regulated by the mass flow controller 241g, and the flow rate-regulated $N_2$ gas is supplied into the processing chamber 201 together with the 3DMAS gas and exhausted through the exhaust pipe 231. Also, at this time, in order to prevent infiltration of the 3DMAS gas into the first nozzle 249a and the second nozzle 249b, the valves 243e and 243f are opened to flow the $N_2$ gas into the first inert gas supply pipe 232e and the third inert gas supply pipe 232g. The $N_2$ gas is supplied into the processing chamber 201 through the first gas supply pipe 232a, the second gas supply pipe 232b, the first nozzle 249a, and the second nozzle 249b, and exhausted through the exhaust pipe 231.

At this time, the APC valve 244 is appropriately adjusted to change the internal pressure of the processing chamber 201 to fall within a range of, for example, 1 to 13,300 Pa, or more specifically, for example, 20 to 1,330 Pa. A supply flow rate of the 3DMAS gas controlled by the mass flow controller 241d is set to fall within a range of, for example, 1 to 1,000 sccm. Supply flow rates of the $N_2$ gas controlled by the mass flow controllers 241g, 241e, and 241f are set to fall within a range of, for example, 100 to 10,000 sccm. A time for supplying the $SiH_3R$ gas to the wafer 200, namely, a gas supply time (an irradiation time), is set to fall within a range of, for example, 1 to 120 seconds, or more specifically, for example, 1 to 60 seconds. The temperature of the wafer 200 may be set to fall within a range of, for example, 250 to 700 degrees C., or more specifically, for example, 300 to 650 degrees C., or further more specifically, for example, 350 to 600 degrees C.

By supplying the 3DMAS gas to the wafer 200 under the above-described conditions, the Si-containing layer containing Cl which is formed on the Si layer on the wafer 200 reacts with the 3DMAS gas. Thus, the Si-containing layer containing Cl is modified to a layer containing silicon (Si), carbon (C), and nitrogen (N), namely, to a SiCN layer. The SiCN layer contains Si, C, and N with a thickness of about less than one atomic layer to several atomic layers. In addition, in the SiCN layer, a ratio of a Si component and a ratio of C component are relatively high, namely, the SiCN layer is a Si and C-rich layer.

(Residual Gas Removal)

After the SiCN layer is formed, the valve 243d of the fourth gas supply pipe 232d is closed to stop the supply of the 3DMAS gas. At this time, the APC valve 244 of the exhaust pipe 231 is in an open state, and the interior of the processing chamber 201 is vacuum-exhausted by the vacuum pump 246. Unreacted $SiH_4$ gas, remaining in the processing chamber 201 after contributing to the formation of the SiCN layer, is removed during the vacuum-exhaustion. Also, at this time, the valves 243g, 243e and 243f are in an open state, and maintain the supply of the $N_2$ gas (inert gas) into the processing chamber 201. The $N_2$ gas acts as a purge gas, and thus the unreacted HCDS gas, remaining in the processing chamber 201 after contributing to the formation of the SiCN layer, can be more effectively removed from the inside of the processing chamber 201.

(Perform Predetermined Number of Times)

The above-described Steps 3 and 4 are set as being included in one cycle, and by performing the cycle one or more times (a predetermined number of times), the SiCN layer of a predetermined thickness may be formed as the initial layer (the seed layer) on the Si layer. In addition, a stacked film in which the Si layer and the SiCN layer, namely, the Si film and the SiCN film, are stacked on the wafer 200 may be formed.

Moreover, the chlorosilane-based precursor gas supplied in Step 3 may use an STC gas, a TCS gas, a DCS gas, an MCS gas, or the like, in addition to the HCDS gas. In addition, the aminosilane-based precursor gas supplied in Step 4 may use a BDEAS gas, a BTBAS gas, a BDEPS gas, a 3DEAS gas, a 4DEAS gas, a 4DMAS gas, or the like, in addition to the 3DMAS gas. The inert gas may include a rare gas such as an Ar gas, a He gas, a Ne gas, a Xe gas, or the like, in addition to the $N_2$ gas.

Additional Embodiments of the Present Disclosure

Hereinabove, various embodiments of the present disclosure has been specifically described, but the present disclosure is not limited to the above-described embodiments, and may be varied without departing from the spirit of the present disclosure.

For example, in the above-described embodiment, an example in which the aminosilane-based precursor is supplied after the chlorosilane-based precursor is supplied to the wafer 200 in the processing chamber 201 has been described. However, the sequence of supplying the precursors may be reversed. That is, the aminosilane-based precursor may be supplied first, and the chlorosilane-based precursor may be supplied afterwards. That is, either one of the chlorosilane-based precursor and the aminosilane-based precursor may be first supplied, and then the other gas may be supplied. As the supply sequence of the precursors is changed, a film quality of the formed thin film can be changed.

Moreover, in the above-described embodiment, the chlorosilane-based precursor and the aminosilane-based precursor are used, but the silane-based precursor having a halogen-based ligand may be used instead of the chlorosilane-based precursor. For example, a fluorosilane-based precursor may be used instead of the chlorosilane-based precursor. Here, the fluorosilane-based precursor is a silane-based precursor having a fluoro group as the halogen group and denotes a precursor including at least silicon (Si) and fluorine (F). A fluorosilane-based precursor gas may include, for example, a silicon fluoride gas such as tetrafluorosilane, namely, a silicon tetrafluoride ($SiF_4$) gas, a hexafluorodisilane ($Si_2F_6$) gas, or the like. In this case, the fluorosilane-based precursor is supplied first, and the aminosilane-based precursor is supplied next to the wafer 200 in the processing chamber 201. Alternatively, the aminosilane-based precursor may be supplied first and the fluorosilane-based precursor is supplied next to the wafer 200 in the processing chamber 201. However, the chlorosilane-based precursor may be used as a silane-based precursor having the halogen group due to a vapor pressure of a precursor or a vapor pressure of a reaction byproduct which is generated in Step 2.

Moreover, for example, in the above-described embodiment, an example in which monoaminosilane ($SiH_3R$) may be used as the second precursor (the aminosilane-based precursor), but the present disclosure is not limited thereto. That is, the second precursor may include, for example, an organic precursor such as diaminosilane ($SiH_2RR'$), triaminosilane ($SiHRR'R''$), tetraminosilane ($SiHRR'R''R'''$), or the like. That is, the second precursor may use a precursor containing two, three, or four amino groups in a composition formula thereof (in its one molecule). Similarly, even a precursor containing a plurality of amino groups in a composition formula thereof (in its one molecule) is used as the second precursor, the silicon film in which an amount of impurities such as carbon (C) or nitrogen (N) is small may be formed at a low temperature range.

As the number of amino groups contained in the composition formula of the second precursor decreases, namely, as an amount of carbon (C) or nitrogen (N) contained in the composition decreases, it is easy to reduce an amount of impurities such as carbon (C) or nitrogen (N) contained in the first layer, and thus, it becomes easy to form the silicon film in which an amount of impurities is very small. That is, when $SiH_3R$, $SiH_2RR'$, or $SiHRR'R''$, instead of $SiHRR'R''R'''$, is used as the second precursor, it becomes easy to reduce an amount of impurities contained in the silicon film. Also, when $SiH_3R$ or $SiH_2RR'$, instead of $SiHRR'R''$, is used as the second precursor, it becomes easy to reduce an amount of impurities contained in the silicon film. In addition, when $SiH_3R$, instead of $SiH_2RR'$, is used as the second precursor, it becomes easy to reduce an amount of impurities contained in the silicon film.

Moreover, by using the silicon film formed by the method of the embodiment as an etch stopper, it is possible to provide technology for forming a device having a good processability. In addition, the silicon film formed by the method of the embodiment may be appropriately applied to various fields such as a floating gate electrode, a control gate electrode, and a channel silicon of a semiconductor memory device, a gate electrode of a transistor, a capacitor electrode of a DRAM, an ST1 liner, a solar cell, etc.

Moreover, in the above-described embodiment, an example in which the silicon film (the Si film) containing silicon (a semiconductor element) is formed as the thin film containing a specific element has been described. However, the present disclosure may be applied to a case that forms a metal-based thin film containing a metal element such as titanium (Ti), zirconium (Zr), hafnium (Hf), tantalum (Ta), aluminum (Al), molybdenum (Mo), or the like.

In this case, film-forming may be performed by a film-forming sequence similar to the above-described embodiment by using a precursor (a first precursor) containing a metal element and a halogen group, instead of the chlorosilane-based precursor, and using a precursor (a second precursor) containing the metal element and an amino group, instead of the aminosilane-based precursor. The first precursor may use, for example, a precursor containing the metal element and a chloro group or a precursor containing the metal element and a fluoro group.

That is, a cycle is performed a predetermined number of times, the cycle including supplying the first precursor containing a metal element and a halogen group to the wafer 200 to form the first layer containing the metal element and the halogen group and supplying the second precursor containing the metal element and an amino group to the wafer 200 to modify the first layer to form the second layer.

During the execution of the cycle for the predetermined number of times, the temperature of the wafer 200 is set such that a ligand containing the amino group is separated from the metal element in the second precursor, the separated ligand reacts with the halogen group in the first layer to remove the halogen group from the first layer, the separated ligand is prevented from being bonded to the metal element in the first layer, and the metal element from which the ligand is separated in the second precursor is bonded to the metal element in the first layer, and a metal element thin film composed of the metal element, namely, a metal film, is formed as a metal-based thin film containing the metal element on the wafer 200.

For example, when a Ti film that is a Ti-based thin film composed of Ti is formed as the metal-based film, the first precursor may include a precursor containing Ti and a chloro group such as titanium tetrachloride (TiCl$_4$) or a precursor containing Ti and a fluoro group such as titanium tetrafluoride (TiF$_4$). The second precursor may include a precursor, containing Ti and an amino group, such as tetrakis(ethylmethylamino)titanium (Ti[N(C$_2$H$_5$)(CH$_3$)]$_4$, abbreviation: TEMAT), tetrakis(dimethylamino)titanium (Ti[N(CH$_3$)$_2$]$_4$, abbreviation: TDMAT), or tetrakis(diethylamido)titanium (Ti[N(C$_2$H$_5$)$_2$]$_4$, abbreviation: TDEAT). Also, the second precursor may include a precursor containing Ti and an amino group in which the number of ligands containing the amino group in a composition formula thereof is two or less and the number of ligands containing a halogen group in a composition formula of the first precursor is two or less. Also, the second precursor may include a precursor containing a single amino group in a composition formula thereof. In addition, in this case, a processing condition may be similar to that of the above-described embodiment.

For example, when a Zr film that is a Zr-based thin film composed of Zr is formed as the metal-based film, the first precursor may use a precursor containing Zr and a chloro group such as zirconium tetrachloride (ZrCl$_4$) or a precursor containing Zr and a fluoro group such as zirconium tetrafluoride (ZrF$_4$). The second precursor may include a precursor containing Zr and an amino group such as tetrakis(ethylmethylamino)zirconium (Zr[N(C$_2$H$_5$)(CH$_3$)]$_4$, abbreviation: TEMAZ), tetrakis(dimethylamino)zirconium (Zr[N(CH$_3$)$_2$]$_4$, abbreviation: TDMAZ), or tetrakis(diethylamido)zirconium (Zr[N(C$_2$H$_5$)$_2$]$_4$, abbreviation: TDEAZ). Also, the second precursor may include a precursor containing Zr and an amino group in which the number of ligands containing the amino group in a composition formula thereof is two or less and the number of ligands containing a halogen group in a composition formula of the first precursor is two or less. Also, the second precursor may use a precursor containing a single amino group in a composition formula thereof. In addition, in this case, a processing condition may be, for example, similar to that of the above-described embodiment.

For example, when a Hf film that is a Hf-based thin film composed of Hf is formed as the metal-based film, the first precursor may include a precursor containing Hf and a chloro group such as hafnium tetrachloride (HfCl$_4$) or a precursor containing Hf and a fluoro group such as hafnium tetrafluoride (HfF$_4$). The second precursor may include a precursor containing Hf and an amino group such as tetrakis(ethylmethylamino)hafnium (Hf[N(C$_2$H$_5$)(CH$_3$)]$_4$, abbreviation: TEMAH), tetrakis(dimethylamino)hafnium (Hf[N(CH$_3$)$_2$]$_4$, abbreviation: TDMAH), or tetrakis(diethylamido) hafnium (Hf[N(C$_2$H$_5$)$_2$]$_4$, abbreviation: TDEAH). Also, the second precursor may include a precursor containing Hf and an amino group in which the number of ligands containing the amino group in a composition formula thereof is two or less and the number of ligands containing a halogen group in a composition formula of the first precursor is two or less. Also, the second precursor may include a precursor containing a single amino group in a composition formula thereof. In addition, in this case, a processing condition may be, for example, similar to that of the above-described embodiment.

As described above, the present disclosure may be applied to formation of a metal-based thin film in addition to a silicon-based thin film, and effects similar to the above-described embodiment can be obtained.

That is, the present disclosure may be applied to a case in which a thin film containing a specific element such as a semiconductor or a metal is formed.

Moreover, the above-described embodiment illustrates an example in which the thin film is formed using a batch type substrate processing apparatus in which a plurality of substrates are processed at a time. However, the present disclosure is not limited thereto but may be applied to a case in which the thin film is formed using a single-wafer type substrate processing apparatus in which several substrates in addition to a single substrate may be processed at a time.

Moreover, the above-described embodiments, modification examples, and application examples may be appropriately combined and used.

In addition, the present disclosure may be realized by varying a process recipe of the alternate substrate processing apparatus. When the process recipe is varied, the process recipe according to the present disclosure may be installed at the alternate substrate processing apparatus via an electrical communication line or a non-transitory computer-readable recording medium in which the process recipe is recorded, or the process recipe itself may be changed to the process recipe according to the present disclosure by manipulating an input/output device of the alternate substrate processing apparatus.

EXAMPLES

Example 1

As an example, the substrate processing apparatus of FIGS. 1 and 2 is used, and a silicon film is formed on a wafer by the above-described film-forming sequence of FIGS. 4 and 5. The HCDS gas is used as the chlorosilane-based precursor gas, and the SiH$_3$R gas is used as the aminosilane-based precursor gas. A temperature of the wafer in film-forming is set to 450 degrees C. Other processing conditions are respectively set to predetermined values within the processing conditions described in the above-described embodiment. Also, in a comparative example, a temperature of a wafer in film-forming is set to 500 degrees C. and 500 degrees C. higher than 450 degrees C., and film-forming is performed using precursor gases similar to those of the example by a method similar to that of the example. In addition, a concentration of each of C, N, and Si contained in respective formed films is measured by an X-ray photoelectron spectroscopy (XPS).

Figure 10:
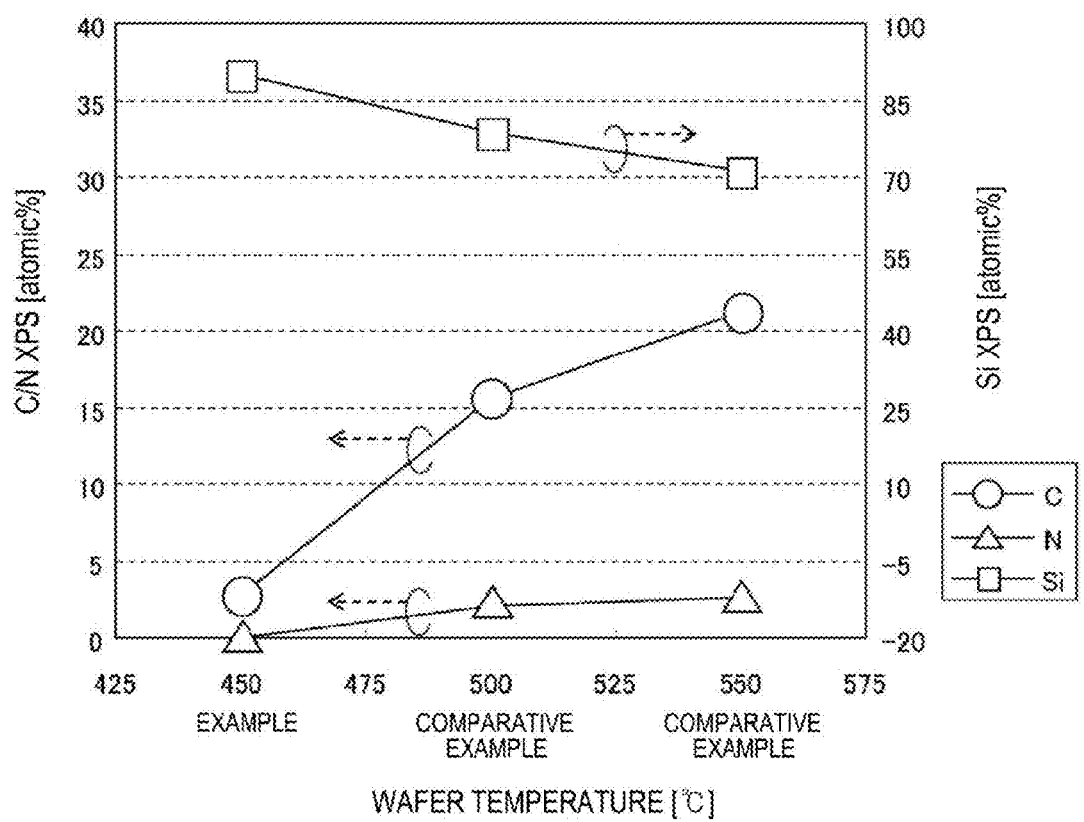
FIG. 10 is a graph showing an XPS measurement result of Example 1 of the present disclosure.

FIG. 10 is a graph showing an XPS measurement result of Example 1 from the present disclosure. In FIG. 10, an abscissa axis indicates a wafer temperature (° C.), a right ordinate axis indicates a Si concentration (atomic %) in a film, and the left ordinate axis indicates a C concentration (atomic %) and a N concentration (atomic %) in the film. In addition, a mark ○ indicates the C concentration in the film, a mark Δ indicates the N concentration in the film, and a mark □ indicates the Si concentration in the film.

As shown in FIG. 10, in C and N impurities contained in the silicon film formed in Example 1, the C concentration is 2.7% or less, the N concentration is less than within a detectable range. All C and N impurities contained in the silicon film formed in Example 1 are within an acceptable impurity level. Accordingly, a high quality silicon film may be formed at a low temperature. Also, in C and N impurities contained in a film formed at a wafer temperature of 500 degrees C. in the comparative example, the C concentration was 15% or more, and the N concentration was 2% or more. In addition, in C and N impurities contained in a film formed at a wafer temperature of 500 degrees C. in the comparative example, the C concentration was 20% or more, and the N concentration was 2.5% or more. As an amount of carbon (C) remaining in the film exceeds the impurity level, carbon acts as a component constituting the film. A silicon carbide film (a SiC film) is formed instead of the silicon film.

Example 2

As another example, the substrate processing apparatus of FIGS. 1 and 2 is used, and a silicon film is formed on a wafer, having a trench in which an aspect ratio is about 50 in a surface, by the above-described film-forming sequence of FIGS. 4 and 5. The HCDS gas is used as the chlorosilane-based precursor gas, and the $SiH_3R$ gas is used as the aminosilane-based precursor gas. A temperature of the wafer in film-forming is set to 450 degrees C. Other processing conditions are respectively set to predetermined values within the processing conditions described in the above-described embodiment. In addition, a cross-sectional surface of the silicon film is observed with a transmission electron microscope (TEM), and a step coverage is measured.

Figure 11A:
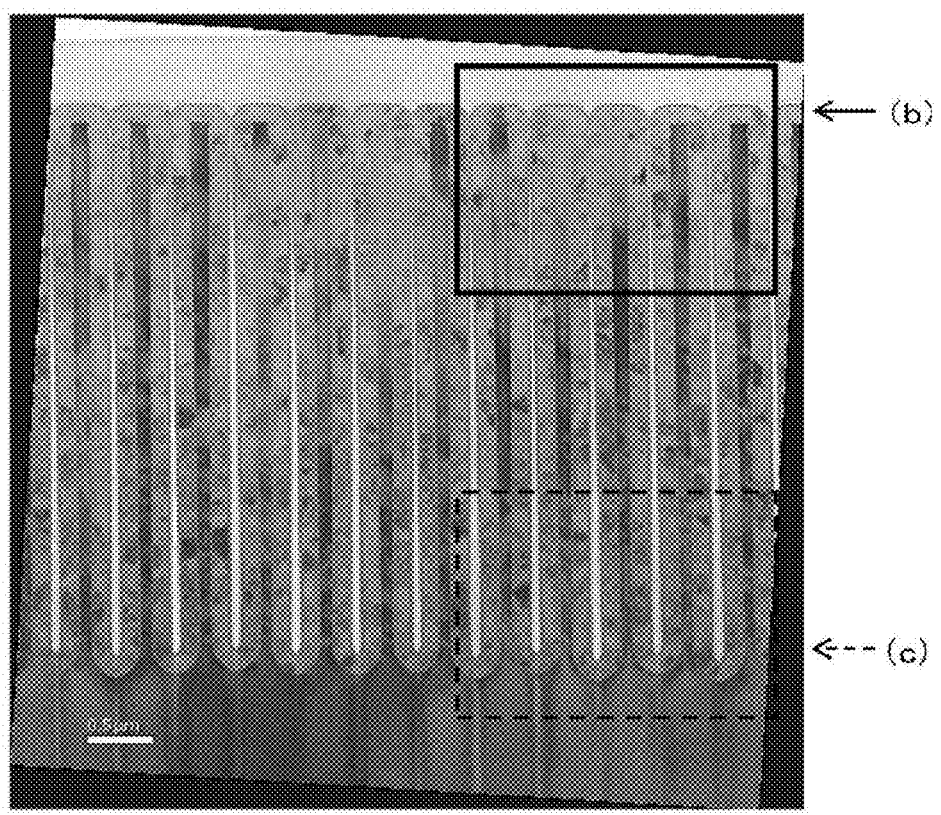
FIG. 11A is a TEM image of Example 2 of the present disclosure.
Figure 11B:
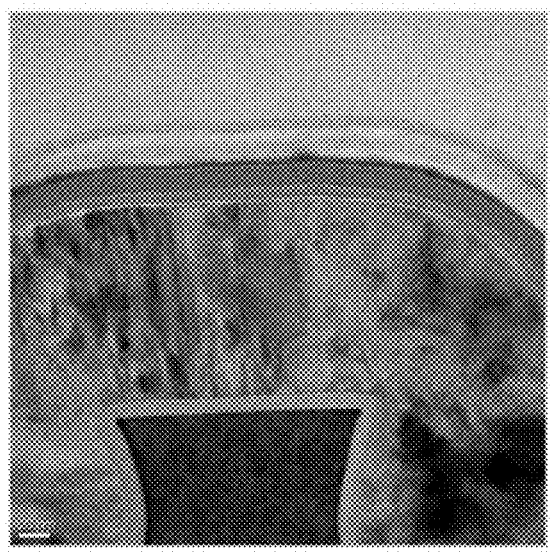
FIGS. 11B and 11C are images in which the TEM image is partially enlarged.
Figure 11C:
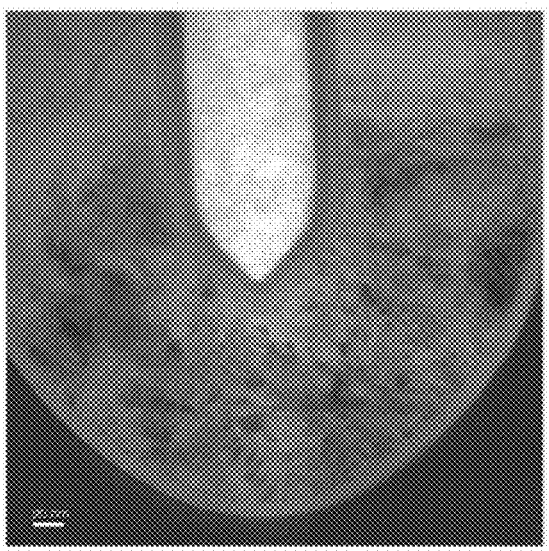

A relevant TEM image is shown in FIG. 11. FIG. 11A is a TEM image of Example 2, FIG. 11B is an image in which a range of a solid line is partially enlarged, and FIG. 11C is an image in which a range of a broken line is partially enlarged. According to Example 2, it can be seen in FIGS. 11A, 11B and 11C that a silicon film, having an excellent flatness, a good uniformity for film thickness, and a high step coverage, can be formed on the wafer having the trench in which the aspect ratio is about 50 in the surface. In addition, in this case, the step coverage of the silicon film in Example 2 is 100%.

<Further Additional Aspects of Present Disclosure>

Hereinafter, some aspects of the present disclosure will be additionally stated.

An aspect of the present disclosure provides a method of manufacturing a semiconductor device including performing a cycle a predetermined number of times to form a thin film composed of a specific element on a substrate, the cycle including: supplying a first precursor containing the specific element and a halogen group to the substrate to form a first layer containing the specific element and the halogen group; and supplying a second precursor containing the specific element and an amino group to the substrate to modify the first layer to form a second layer, wherein in the act of performing the cycle the predetermined number of times, a temperature of the substrate is set such that a ligand containing the amino group is separated from the specific element in the second precursor, the separated ligand reacts with the halogen group in the first layer to remove the halogen group from the first layer, the separated ligand is prevented from being bonded to the specific element in the first layer, and the specific element from which the ligand is separated in the second precursor is bonded to the specific element in the first layer.

In some embodiments, the temperature of the substrate may be set to fall within a range of 300 to 450 degrees C.

In some embodiments, the temperature of the substrate may be set to fall within a range of 350 to 450 degrees C.

Another aspect of the present disclosure provides a method of manufacturing a semiconductor device including performing a cycle a predetermined number of times to form a thin film composed of a specific element on a substrate, the cycle including: supplying a first precursor containing the specific element and a halogen group to the substrate; and supplying a second precursor containing the specific element and an amino group to the substrate, wherein a temperature of the substrate is set to fall within a range of 300 to 450 degrees C.

In some embodiments, the temperature of the substrate may be set to fall within a range of 350 to 450 degrees C.

In some embodiments, the second precursor may contain one amino group in a composition formula thereof (in its one molecule).

In some embodiments, the specific element may include a semiconductor element or a metal element.

In some embodiments, the specific element may include a silicon element.

In some embodiments, the specific element may include a silicon element, and the thin film may include a silicon film.

Another aspect of the present disclosure provides a method of manufacturing a semiconductor device including performing a cycle a predetermined number of times to form a silicon film on a substrate, the cycle including: supplying a first precursor containing silicon and a halogen group to the substrate; and supplying a second precursor containing the silicon and an amino group to the substrate, wherein a temperature of the substrate is set to fall within a range of 300 to 450 degrees C.

Another aspect of the present disclosure provides a method of manufacturing a semiconductor device including performing a cycle a predetermined number of times to form a silicon film on a substrate, the cycle including: supplying a first precursor containing silicon and a halogen group to the substrate to form a first layer containing the silicon and the halogen group; and supplying a second precursor containing the silicon and an amino group to the substrate to modify the first layer to form a second layer, wherein in the act of performing the cycle the predetermined number of times, a temperature of the substrate is set such that a ligand containing the amino group is separated from silicon in the second precursor, the separated ligand reacts with the halogen group in the first layer to remove the halogen group from the first layer, the separated ligand is prevented from being bonded to silicon in the first layer, and the silicon from which the ligand is separated in the second precursor is bonded to the silicon in the first layer.

In some embodiments, the second precursor may contain one amino group in a composition formula thereof (in its one molecule).

In some embodiments, the second precursor may include monoaminosilane.

Another aspect of the present disclosure provides a method of processing a substrate. The method includes performing a cycle a predetermined number of times to form a thin film composed of a specific element on a substrate, the cycle including: supplying a first precursor containing the specific element and a halogen group to the substrate to form a first layer containing the specific element and the halogen group; and supplying a second precursor containing the specific element and an amino group to the substrate to modify the first layer to form a second layer, wherein in the act of performing the cycle the predetermined number of times, a temperature of the substrate is set such that a ligand containing the amino group is separated from the specific element in the second precursor, the separated ligand reacts with the halogen group in the first layer to remove the halogen group from the first layer, the separated ligand is prevented from being bonded to the specific element in the first layer, and the specific element from which the ligand is separated in the second precursor is bonded to the specific element in the first layer.

Another aspect of the present disclosure provides a method of processing a substrate including performing a cycle a predetermined number of times to form a thin film composed of a specific element on a substrate, the cycle including: supplying a first precursor containing the specific element and a halogen group to the substrate and supplying a second precursor containing the specific element and an amino group to the substrate, wherein a temperature of the substrate is set to fall within a range of 300 to 450 degrees C.

Another aspect of the present disclosure provides a substrate processing apparatus including: a processing chamber configured to accommodate a substrate; a first precursor supply system configured to supply a first precursor containing a specific element and a halogen group to the substrate in the processing chamber; a second precursor supply system configured to supply a second precursor containing the specific element and an amino group to the substrate in the processing chamber; a heater configured to heat the substrate in the processing chamber; and a control unit configured to control the first precursor supply system, the second precursor supply system, and the heater such that a thin film composed of the specific element is formed on the substrate by performing a cycle a predetermined number of times, the cycle including: supplying the first precursor to the substrate to form a first layer containing the specific element and the halogen group; and supplying the second precursor to the substrate to modify the first layer to form a second layer, and a temperature of the substrate being set to a temperature at which a ligand containing the amino group is separated from the specific element in the second precursor, the separated ligand reacts with the halogen group in the first layer to remove the halogen group from the first layer, the separated ligand is prevented from being bonded to the specific element in the first layer, and the specific element from which the ligand is separated in the second precursor is bonded to the specific element in the first layer.

Another aspect of the present disclosure provides a substrate processing apparatus including: a processing chamber configured to accommodate a substrate; a first precursor supply system configured to supply a first precursor containing a specific element and a halogen group to the substrate in the processing chamber; a second precursor supply system configured to supply a second precursor containing the specific element and an amino group to the substrate in the processing chamber; a heater configured to heat the substrate in the processing chamber; and a control part configured to control the first precursor supply system, the second precursor supply system, and the heater such that a thin film composed of a specific element is formed on the substrate performing a cycle a predetermined number of times, the cycle including: supplying the first precursor to the substrate in the processing chamber and supplying the second precursor to the substrate in the processing chamber, wherein a temperature of the substrate is set to fall within a range of 300 to 450 degrees C.

Another aspect of the present disclosure provides a program that causes a computer to perform a process of performing a cycle a predetermined number of times to form a thin film composed of a specific element on a substrate in a processing chamber. The cycle includes: supplying a first precursor containing the specific element and a halogen group to the substrate in the processing chamber to form a first layer containing the specific element and the halogen group; and supplying a second precursor containing the specific element and an amino group to the substrate in the processing chamber to modify the first layer to form a second layer, wherein in the process of performing the cycle the predetermined number of times, a temperature of the substrate is set to a temperature at which a ligand containing the amino group is separated from the specific element in the second precursor, the separated ligand reacts with the halogen group in the first layer to remove the halogen group from the first layer, the separated ligand is prevented from being bonded to the specific element in the first layer, and the specific element from which the ligand is separated in the second precursor is bonded to the specific element in the first layer.

Another aspect of the present disclosure provides a program that causes a computer to perform a process of forming a thin film composed of a specific element on a substrate in a processing chamber by performing a cycle a predetermined number of times. The cycle includes: supplying a first precursor containing the specific element and a halogen group to the substrate in the processing chamber; and supplying a second precursor containing the specific element and an amino group to the substrate in the processing chamber, wherein a temperature of the substrate is set to fall within a range of 300 to 450 degrees C.

Another aspect of the present disclosure provides a non-transitory computer-readable recording medium storing a program that causes a computer to perform a process of forming a thin film composed of a specific element on a substrate in a processing chamber by performing a cycle a predetermined number of times. The cycle includes: supplying a first precursor containing the specific element and a halogen group to the substrate in the processing chamber to form a first layer containing the specific element and the halogen group; and supplying a second precursor containing the specific element and an amino group to the substrate in the processing chamber to modify the first layer to form a second layer, wherein in the process of performing the cycle the predetermined number of times, a temperature of the substrate is set such that a ligand containing the amino group is separated from the specific element in the second precursor, the separated ligand reacts with the halogen group in the first layer to remove the halogen group from the first layer, the separated ligand is prevented from being bonded to the specific element in the first layer, and the specific element from which the ligand is separated in the second precursor is bonded to the specific element in the first layer.

Another aspect of the present disclosure provides a non-transitory computer-readable recording medium storing a program that causes a computer to perform a process of forming a thin film composed of a specific element on a substrate in a processing chamber of a substrate apparatus by performing a cycle a predetermined number of times, the cycle including: supplying a first precursor containing the specific element and a halogen group to the substrate in the processing chamber; and supplying a second precursor containing the specific element and an amino group to the substrate in the processing chamber, wherein a temperature of the substrate is set to fall within a range of 300 to 450 degrees C.

According to a method of manufacturing a semiconductor device, a substrate processing apparatus, and a recording medium according to the present disclosure; a thin film containing a specific element, such as a silicon film, can be formed at a low temperature range.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, the method comprising:
   (a) forming a seed layer consisting of a specific element on a substrate by performing a cycle a predetermined number of times, the cycle comprising:
       supplying a first precursor containing the specific element and a halogen group to the substrate to form a first layer containing the specific element and the halogen group; and
       supplying a second precursor containing the specific element and an amino group to the substrate to modify the first layer to form a second layer, the second precursor containing one amino group in each molecule of the second precursor; and
   (b) forming a thin film consisting of the specific element on the seed layer by supplying a third precursor containing the specific element and hydrogen,
   wherein the seed layer and the thin film contain no carbon and nitrogen.

2. The method of claim 1, wherein a temperature of the substrate is set to fall within a range of 300 to 450 degrees C. in the (a), and the temperature of the substrate is set to fall within a range of 350 to 700 degrees C. in the (b).

3. The method of claim 1, wherein a temperature of the substrate is set to fall within a range of 350 to 450 degrees C. in the (a), and the temperature of the substrate is set to fall within a range of 350 to 700 degrees C. in the (b).

4. The method of claim 1, wherein the thin film consisting of the specific element is formed by a chemical vapor deposition method.

5. The method of claim 1, wherein the specific element comprises a semiconductor element or a metal element.

6. The method of claim 1, wherein the specific element comprises silicon, and the thin film comprises a silicon film.

7. The method of claim 6, wherein the second precursor comprises monoaminosilane.

8. The method of claim 7, wherein the first precursor comprises chlorosilane.

9. The method of claim 8, wherein the third precursor comprises an inorganic silane-based gas.

10. The method of claim 8, wherein the third precursor comprises a silane-based gas containing no chlorine.

11. The method of claim 8, wherein the third precursor comprises at least one selected from a group consisting of monosilane, disilane and trisilane.

12. A method of manufacturing a semiconductor device, the method comprising:
    (a) forming a silicon seed layer on a substrate by performing a cycle a predetermined number of times, the cycle comprising:
        supplying a first precursor containing silicon and a halogen group to the substrate to form a first layer containing the silicon and the halogen group; and
        supplying a second precursor containing silicon and an amino group to the substrate to modify the first layer to form a second layer, the second precursor containing one amino group in each molecule of the second precursor; and
    (b) forming a silicon film on the seed layer by supplying a third precursor containing silicon and hydrogen,
    wherein the seed layer and the thin film contain no carbon and nitrogen.

13. The method of claim 12, wherein a temperature of the substrate is set to fall within a range of 300 to 450 degrees C. in the (a), and the temperature of the substrate is set to fall within a range of 350 to 700 degrees C. in the (b).

14. The method of claim 12, wherein a temperature of the substrate is set to fall within a range of 350 to 450 degrees C. in the (a), and the temperature of the substrate is set to fall within a range of 350 to 700 degrees C. in the (b).

15. A non-transitory computer-readable recording medium storing a program that causes a computer to perform:
    (a) forming a seed layer consisting of a specific element on a substrate by performing a cycle a predetermined number of times, the cycle comprising:
        supplying a first precursor containing the specific element and a halogen group to the substrate to form a first layer containing the specific element and the halogen group; and
        supplying a second precursor containing the specific element and an amino group to the substrate to modify the first layer to form a second layer, the second precursor containing one amino group in each molecule of the second precursor; and
    (b) forming a thin film consisting of the specific element on the seed layer by supplying a third precursor containing the specific element and hydrogen,
    wherein the seed layer and the thin film contain no carbon and nitrogen.

* * * * *